United States Patent

Muranishi et al.

Patent Number: 5,448,536
Date of Patent: Sep. 5, 1995

[54] MAGNETO-OPTICAL RECORDING DEVICE HAVING AN OPTICAL HEAD CAPABLE OF GENERATING A CIRCULARLY POLARIZED LIGHT BEAM

[75] Inventors: Masaru Muranishi, Ibaraki; Hidehiko Kando, Matsudo; Mamoru Kainuma; Katsuhiko Kimura, both of Ibaraki, all of Japan

[73] Assignee: Hitachi, Ltd., Tokyo, Japan

[21] Appl. No.: 76,863

[22] Filed: Jun. 15, 1993

[30] Foreign Application Priority Data

Jun. 16, 1992 [JP] Japan ................ 4-156543
Sep. 18, 1992 [JP] Japan ................ 4-249567

[51] Int. Cl.$^6$ ............ G11B 13/04; G11B 7/00
[52] U.S. Cl. ................ 369/13; 369/112; 369/44.14; 369/275.1
[58] Field of Search ........ 369/13, 14, 15, 112, 369/44.14, 116, 275.1; 360/59, 114; 365/122; 372/45, 59, 87, 92, 106

[56] References Cited

U.S. PATENT DOCUMENTS

| | | | |
|---|---|---|---|
| 4,607,359 | 8/1986 | Matsubayashi et al. | 369/44.14 |
| 5,070,494 | 12/1991 | Emoto et al. | 369/13 |
| 5,182,735 | 1/1993 | Kurtz et al. | 369/13 |
| 5,200,934 | 4/1993 | Mansuripur | 369/13 |
| 5,200,939 | 4/1993 | Nishiwaki et al. | 369/112 |
| 5,235,570 | 8/1993 | Kurtz et al. | 369/13 |
| 5,235,588 | 8/1993 | Miura et al. | 369/13 |
| 5,278,811 | 1/1994 | Chao | 369/13 |
| 5,394,381 | 2/1995 | Fukumoto et al. | 369/13 |

FOREIGN PATENT DOCUMENTS

| | | |
|---|---|---|
| 3-18835 | 1/1991 | Japan . |
| 311783 | 1/1991 | Japan . |
| 3181043 | 8/1991 | Japan . |

*Primary Examiner*—Georgia Y. Epps
*Assistant Examiner*—Tan Dinh
*Attorney, Agent, or Firm*—Antonelli, Terry, Stout & Kraus

[57] ABSTRACT

In a magneto-optical recording and reproducing apparatus, a magnetic field is applied to a laser source in the direction of extension of the optical axis of the laser source to radiate a circularly polarized light beam. A magneto-optical disk has a quantum well structure and records information on the disk with the circularly polarized light beam in a magneto-optical manner.

28 Claims, 21 Drawing Sheets

BEFORE LIGHT ABSORPTION

AFTER LIGHT ABSORPTION

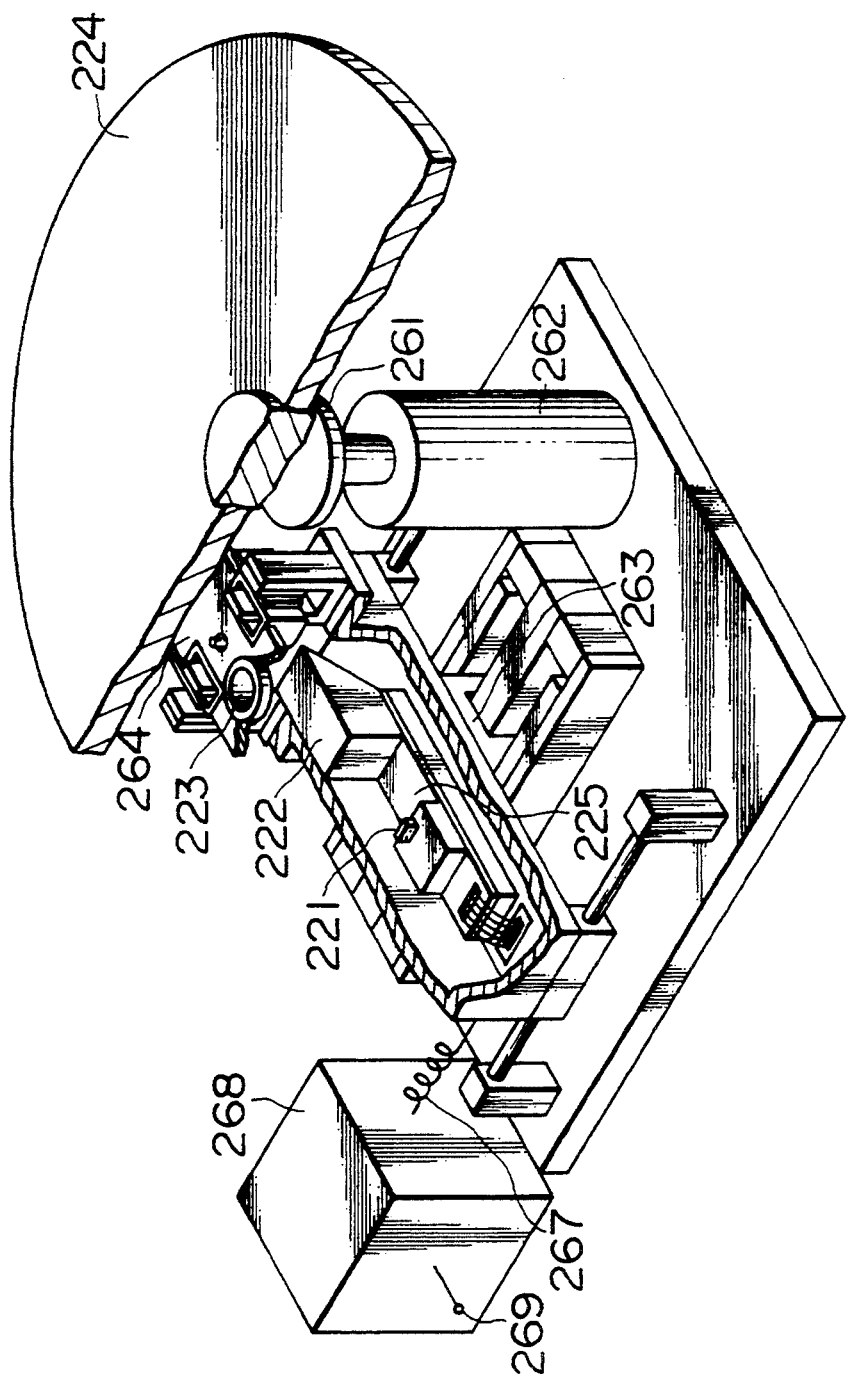

MAGNETO-OPTICAL RECORDING DEVICE HAVING AN OPTICAL HEAD CAPABLE OF GENERATING A CIRCULARLY POLARIZED LIGHT BEAM

BACKGROUND OF THE INVENTION

The present invention relates to optical recording and reproducing apparatus which magneto-optically reads and writes data out of and to a magneto-optical recording medium, magneto-optical magnetic heads and magneto-optical magnetic recording mediums.

Conventionally, various system are proposed as a magneto-optical recording and reproducing apparatus, one example of which casts a circularly polarized light beam on a recording layer of a magneto-optical medium to generate a local magnetic field therein, switches the direction of the magnetic field depending on whether the rotational direction of the electrical vector of the polarized light beam is clockwise or counterclockwise to locally reverse the direction of magnetization of the recording layer of the medium to thereby record data on the recording layer, as disclosed in JP-A-2-181043 published Aug. 7, 1991.

In this conventional system, the means which switches the right- and left-handed rotation directions of the circularly polarized light beam uses an arrangement which rotates the positional relationship of a polarizer which constitute an optical system of the optical head and a ¼ wave plate, relative to the optical axis and each other.

A laser light source used in a magneto-optical disk device and a magneto-optical tape device is disclosed, for example, in JP-A-3-11783 and 3-18835.

When information is recorded in conventional magneto-optical recording and reproducing apparatus such as magneto-optical disk devices and magneto-optical tape devices, a magnetic field having a predetermined direction is applied to a recording medium and simultaneously a light beam of a predetermined strength is cast on the medium to erase the information recorded already on the medium, then a magnetic field of an opposite direction and a light beam having a modulated strength is cast simultaneously on the medium to record information on the medium. Thus, it takes much time for the information to be recorded. In addition, a magnetic head which applies the magnetic field is required.

SUMMARY OF THE INVENTION

It is one object of the present invention to provide a magneto-optical recording and reproducing apparatus which provides an increased speed of recording and reproducing information.

It is another object of the present invention to provide a miniaturized optical head which may be used in the magneto-optical recording and reproducing apparatus.

According to one aspect of the present invention, in a magneto-optical recording and reproducing apparatus which casts a circularly polarized laser beam on a magneto-optical disk to record and reproduce information to and out of the recording film, an optical head which generates the laser beam includes a plurality of laser sources disposed so as to be driven radially of the disk with a spacing from the disk and means for applying a magnetic field to a respective one of the laser sources in the direction of its optical axis. The head is driven by an actuator radially of the disk in order to record and reproduce information.

According to another aspect of the present invention, a magneto-optical recording and reproducing apparatus uses a circularly polarized light beam to omit a process for erasing the information recorded so far to thereby reduce the time taken for recording information and to omit a magnetic head to thereby reduce the number of components of the apparatus.

According to a further aspect of the present invention, a laser source used in an optical head, comprises:

an active layer supplied with an electric current for radiating a light beam;

a pair of electrodes for supplying an electric current to the active layer;

a resonator comprising a pair of opposing reflecting means between which the active layer is disposed for reflecting the light beam radiated from the active layer;

the active layer and the resonator each having a structure axially symmetrical around the optical axis of a light beam which resonates in the resonator; and a coil winding for applying a magnetic field to the active layer such that the magnetic field acting on the active layer is coincident in direction with a light beam propagating through the active layer.

According to a further aspect of the present invention, a magneto-optical recording medium usable in a magneto-optical recording and reproducing apparatus comprises a multi-layered structure which includes a magnetic film provided on a baseplate with information being recorded and reproduced to and out of the magnetic film by optical means. The multi-layered film structure resonates with the waveform of a light beam cast on the recording medium in the recording of information and has a quantum well structure.

According to another aspect of the present invention, an optical head comprises a laser source, a first optical system for casting a light beam radiated from the laser source on a magneto-optical recording medium; a photodetector for converting a light beam to an electrical signal; and a second optical system for guiding a light beam transmitting through or reflected by the magneto-optical recording medium to the photodetector, whereby information is reproduced by casting a light beam on the recording medium and information is reproduced by the light beam transmitting through or reflected by the recording medium. More particularly, the optical head casts a circularly polarized light beam on the recording medium to switch the circularly polarized light beam between a right- and a left-handed circularly polarized light beam for recording purposes.

The laser source which radiates a circularly polarized light beam includes the means for applying a magnetic field in the direction of the optical axis of the laser source. When the direction of application of the magnetic field by the magnetic field applying means is changed, the circularly polarized light beam radiated from the laser source is changed to a one having a right- or a left-handed direction of rotation reverse to the direction of rotation of the beam used so far. By casting this right- or left-handed circularly polarized light beam on a recording layer of a magneto-optical recording medium, the direction of magnetization of the recording layer is reversed.

As described above, by changing the direction of application of the magnetic field of the magnetic field application means, the direction of rotation of the circularly polarized light beam is changed rapidly. Thus, recording and reproducing information is effected at an increased speed.

When a circularly polarized light beam is absorbed by a material, the material is magnetized in the direction of the optical axis of the light beam incident to thereon in conformity to law of angular momentum conservation. The multi-layer including a thin magnetic film should resonate with the wavelength of the light beam incident thereon and have a quantum well structure. The multilayered structure should have a periodic structure where the length of an optical path for one period is one fourth of the wavelength of the incident light beam. This causes high absorption of the incident light beam to thereby cause large magnetization. The resulting magnetic field changes the direction of magnetization of the magnetic film.

BRIEF DESCRIPTION OF THE DRAWINGS

FIG. 25 is a perspective view of a magneto-optical recording and reproducing apparatus as one embodiment of the present invention.

DESCRIPTION OF THE PREFERRED EMBODIMENTS

Figure 1:
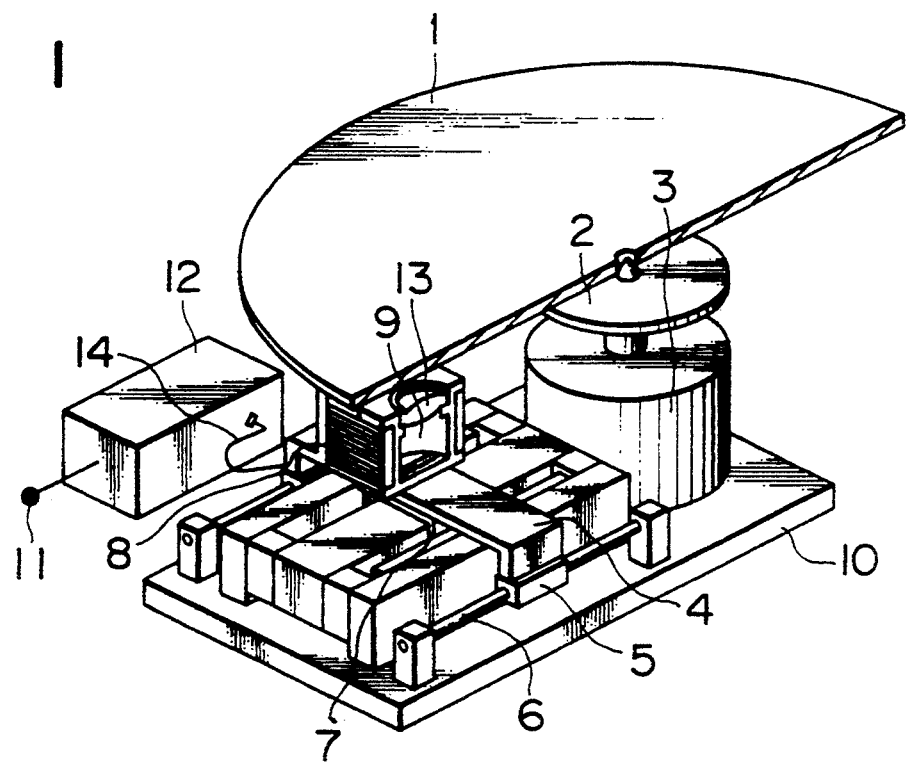
FIG. 1 is a partially cross-sectional perspective view of one embodiment of a magneto-optical recording and reproducing apparatus according to the present invention.

FIG. 1 is a partially cross-sectional perspective view of one embodiment of a magneto-optical recording and reproducing apparatus according to the present invention. In FIG. 1, a magneto-optical disk 1 is fixed removably by a magnet chuck 2 to a spindle motor 3. The disk 1 is rotated by the spindle motor 3, which is provided on a base 10. A carriage 4 is provided through a bearing 5 on a rail 6 such that it cannot move in any directions except that it is moved by a course actuator 7 radially of the disk 1. A fine actuator 8 is provided on the carriage 4 so as to drive an optical head which includes one or more light sources and an objective 13. The fine actuator 8 is capable of moving the head 9 relative to the carriage 4 in any one of a direction normal to the disk face, a direction of rotation around an axis aligning with that normal direction and an axial direction of the disk 1.

An external command is input through a terminal 11 to a system controller 12 of the apparatus. When there is an incoming external command, the system controller 12 feeds an electric current to the spindle motor 3 to rotate the disk 1 and also feeds an electric current to the head 9 to thereby cast a light beam on the disk 1, using the focusing operation of the objective 13. The head 9 generates a focusing error signal indicative of blooming of the light beam cast on the disk 1, and a track error signal indicative of a deviation of the cast light beam from a track and which is a train of bits which records information. These signals are input through a cable 14 to the system controller 12, which feeds electric currents to the course actuator 7 and fine actuator 8 on the basis of those signals to move the head 9 in order to cast a light beam at a predetermined position on the disk 1. When the external command is one to record information, and the head 9 has moved to the predetermined position, the head 9 casts right- and left-handed circularly polarized beams on the disk 1 to magnetically record information on a magnetic film on the disk 1 in correspondence to binary data to be recorded, using optical induction magnetization. When the external command is one to reproduce information, the head 9 casts a linearly polarized light beam on the disk 1 to read information recorded on the disk 1 on the basis of a change in the direction of polarization of the reflected light beam and to output the information through the system controller 12 and terminal 11.

Figure 2:
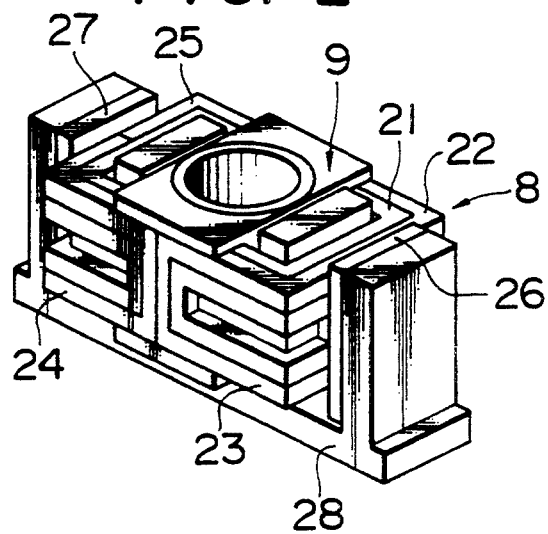
FIG. 2 is an enlarged perspective view of a fine actuator which may be used in the apparatus of FIG. 1.

FIG. 2 is an enlarged perspective view of the fine actuator which may be used in the apparatus of FIG. 1. In FIG. 2, the fine actuator 8 which drives a magneto-optical pickup 9 in a three-dimensional manner includes coils 21-25, magnets 26, 27, and a yoke 28. The coils 21-25 are each adapted to be supplied independently with an electric current.

Figure 3:
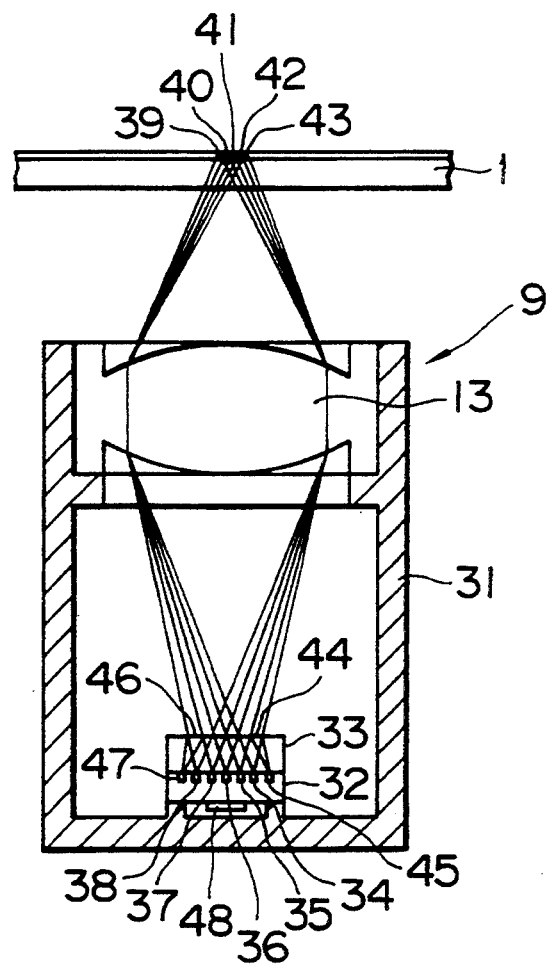
FIG. 3 is a longitudinal cross-sectional view of an optical head as one embodiment of the present invention.

FIG. 3 is a longitudinally cross-sectional view of an optical head as one embodiment of the present invention and additionally shows a magneto-optical disk. In FIG. 3, the head 9 is provided with a package 31, an objective 13 attached to the package, a semiconductor substrate 32, for example, made of GaAs, a detection optical system 33 attached to the substrate 32, and a piezoelectric element 48. Provided on the substrate 32 are plane light emission type laser source units 34-38, the light beams emitted from which form corresponding focuses 39-43 on the disk 1 through the objective 13. Generally, an objective used in the magneto-optical recording and reproducing apparatus has a tolerance of ±100 μm. If the laser sources 34-38 have a size of about 20 μm, they can all be arranged within that tolerance, The laser source units 35-37 are for recording and reproducing binary information and emit a circularly polarized light beam in the recording of information while they emit a linearly polarized light beam in the reproduction of information. In addition, the circularly polarized light beam is switched to a right- or a left-handed circular polarization in accordance with the logical level of each information bit. The laser source units 34 and 38 are for generating a servo signal and emit a linearly polarized light beam irrespective of whether information is recorded or reproduced. The light beam emitted from the laser source unit 34 is focused by the objective 13 through the detection optical system 33 to form a focus 39. The light focused at the focal point 39 is reflected by a recording film of the disk 1 to again pass through the objective 13 to enter the detection optical system 33. Part of the light is refracted by a refractive grating provided in the optical system 44 to enter the detector 45. A focusing error signal and a tracking error signal are generated from the strength distribution of light on the optical detector 45. The light emitted from the laser source unit 38 passes through the detection optical system 33 and is focused by the objective 13 to form a focus 43. The light focused at the focus 43 is reflected by the recording film of the disk 1 to again pass through the objective 13 to enter the detection optical system 33, a part of which light is refracted by a refraction grating 46 provided on the optical system 33 to enter a photodetector 47 on the basis of the strength distribution of which a focusing error signal and a tracking error signal are generated. The laser source units 34-38 can be individually turned on or off to thereby record and reproduce information to and out of three tracks simultaneously.

Figure 4:
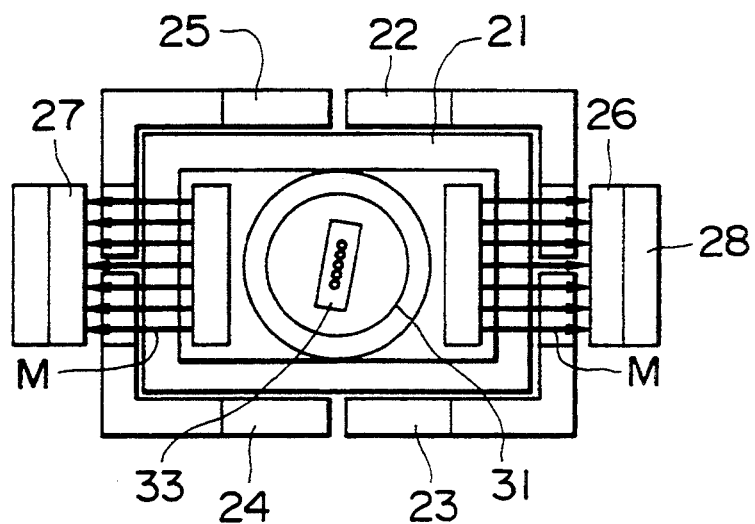
FIG. 4 is a traverse cross-sectional view of a fine actuator and an optical head which may be used in the apparatus of FIG. 1.

FIG. 4 is a transverse cross-sectional view of the fine actuator 8 and the head 9 which may be used in the FIG. 1 apparatus and shows the arrangement of coils 21-25 and the magnetic fields M produced by the magnets 26 and 27.

Figure 5:
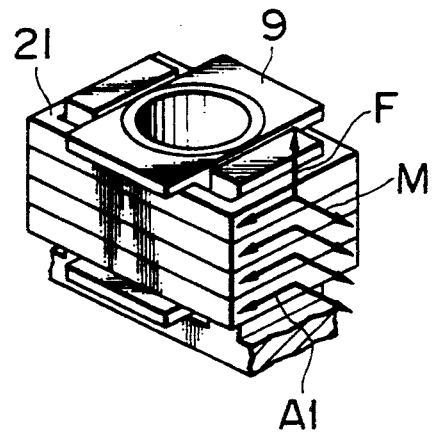
FIG. 5 is a perspective view of a focusing mechanism which may be used in the apparatus of FIG. 1 and explains the operation of the mechanism.

FIG. 5 is a perspective view of a focusing mechanism usable in the apparatus of FIG. 1. In FIG. 5, an electric current A1 flows through a coil 21. Since the magnetic field M acts as shown by the arrow in FIG. 5, an upward force F acts on the coil 21. By reversing the direction of the current A1, a downward force may be applied. By the force acting on the coil 21, the optical pickup 9 is moved normal to the surface of the disk 1 for focusing purposes.

Figure 6:
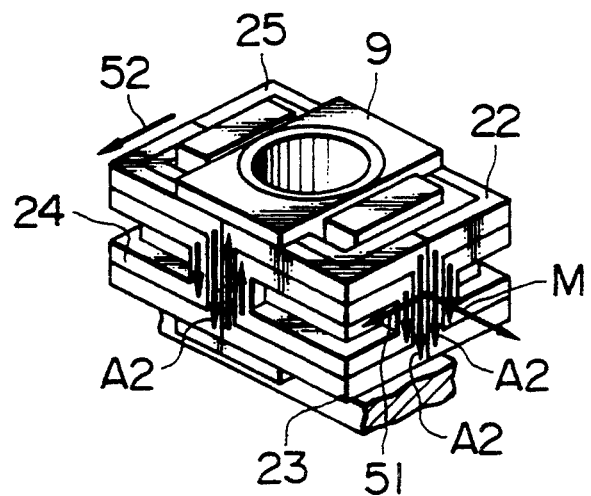
FIG. 6 is a perspective view of a tracking mechanism which may be used in the apparatus of FIG. 1 and explains the operation of the mechanism.

FIG. 6 is a perspective view of a tracking mechanism usable in the apparatus of FIG. 1 and explains the operation of the mechanism. In FIG. 6, a force 51 acts on the coils 22 and 23 by flowing a current such as A2 shown in FIG. 6 through the coils. By flowing a current A2 shown in FIG. 6 through the coil 24 and also flowing an upward current A2 through the portion of the coil 25 on which the magnetic field M due to the magnet 27 of FIG. 4 acts, a force 52 acts on that coil portion. By reversing the direction of the currents flowing through the coils 22-25, the direction of the acting force is reversed. By these forces, the head 9 is moved radially of the disk 9 and tracking is effected.

Figure 7:
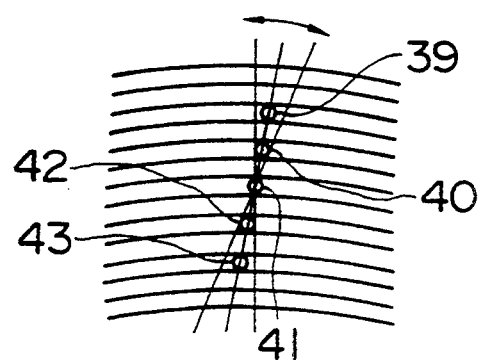
FIG. 7 illustrates the positional relationship between spots of light beams from a plurality of light sources and tracks.

FIG. 7 illustrates the positional relationship between tracks and beam spots from the five laser source units 34-38 of FIG. 5. When the temperature of the semiconductor substrate 32 of FIG. 3 changes, the distance between any two of the laser source units 34-37 changes due to thermal expansion. Thus, when the spacing between any two of the beam spots 39-43 on the disk 1 change, in which case, for example, when the respective spacings are increased, there occurs a difference between a tracking error signal generated by the photodetector 45 and a tracking error signal generated by the photodetector 47. Thus, a tracking servo operation should be effected with respect to the average value of the tracking error signals generated by the photodetectors 45 and 47, and the head 9 should be rotated through an angle corresponding to a difference between a deviation of the spot 39 and a deviation of the spot 43.

Figure 8:
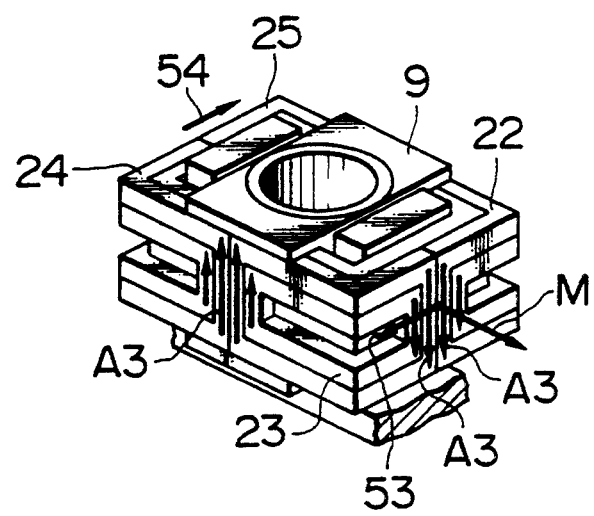
FIG. 8 is a perspective view of an optical head rotation mechanism which may be used in the apparatus of FIG. 1 and explains the operation of the mechanism.

FIG. 8 is a perspective view of an optical head rotation mechanism which may be used in the apparatus of FIG. 1 and illustrates the operation of the mechanism. By flowing electric currents A3 through the coils 22, 23, as shown in FIG. 8, a force 53 acts on those coils. By flowing the electric current A3 through the coil 24, as shown in FIG. 8, and by flowing a downward electric current A3 through that portion of the coil 25 on which a magnetic field M generated by a magnet 27 shown in FIG. 4 acts, a force 54 acts on that coil portion. By reversing the directions of the currents flowing through the coils 22-25, the directions of the acting forces are reversed. By the moment of these forces, the optical pickup 9 is rotated around the optical axis.

Figure 9:
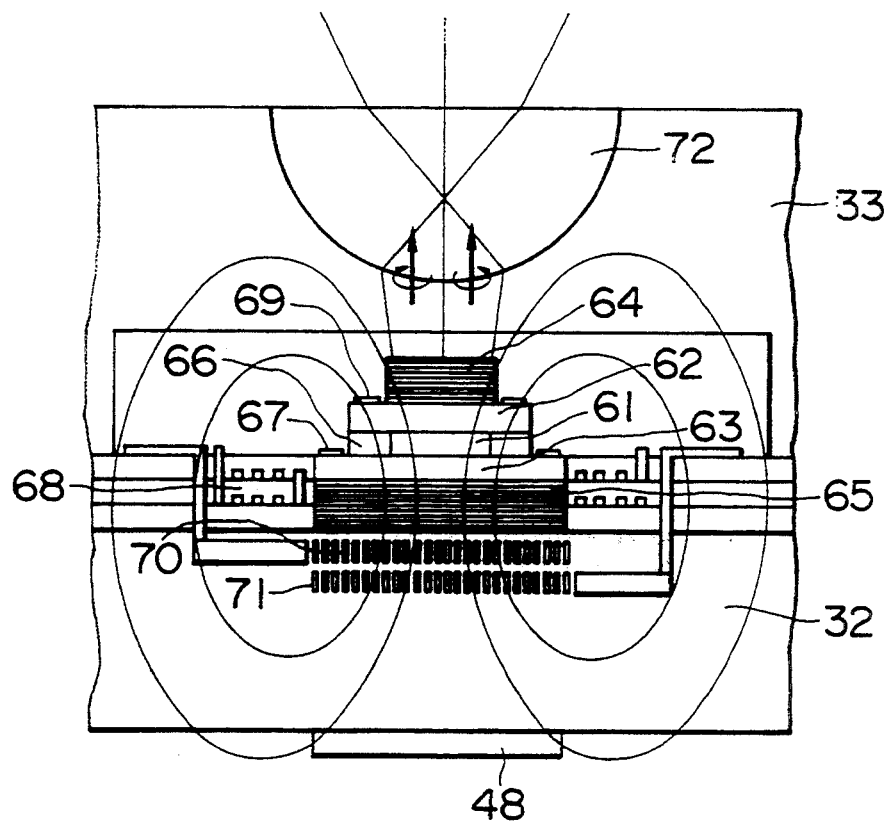
FIG. 9 is an enlarged longitudinal cross-sectional view of an optical head as one embodiment of the present invention and explains its information recording operation.

FIG. 9 is an enlarged cross-sectional view of a laser source unit 35 of the optical head as one embodiment of the present invention and illustrates the information recording operation of the head. Laser source units 36, 37 have exactly the same structure. The semiconductor substrate 32 has photodetectors 71, 70 provided thereon. Provided on the photodetector 70 are a reflective layer 65, a conductive layer 63, an active layer 61, an insulating layer 66, a conductive layer 62, a reflective layer 64, and coil windings 68. A piezoelectric element 48 is provided on the opposite side of the substrate 32. An electric current is flowed through the active layer 61, electrodes 69, 67, and conductive layers 62, 63 to thereby emit light from the active layer. By the insulating layer 66, the current collects in the active layer 61 to increase the carrier density. The active layer 61 is sandwiched between the reflective layers 64, 65 of a thin multi-layered film such that light emitted from the active layer 61 travels between those reflective layers. The emitted light having a mode of producing resonance between the reflective layers 64, 65 generates laser oscillation. The laser source unit 35 has an axially symmetrical structure together with the active layer 61 and reflective layers 64, 65, so that laser oscillation is possible in any of right- and left-handed circular polarization modes. By flowing an electric current through the coil 68, magnetic fields are applied to the active layer 61 and the reflective layers 64, 65, which causes the electron energy levels within the active layer 61 and reflective layers 64, 65 change depending on the direction of spin of the electrons. This causes the gains of the active layer 61 to right- and left-handed circularly polarized light beams to be different from each other. The reflectivities of each of the reflective layers 64, 65 to right- and left-handed circularly polarized light beams are different from each other. Thus, the gains of the laser source unit 35 to right- and left-handed circularly polarized light beams are different from each other. Only laser oscillation having a maximum gain is selected among various states of oscillation to thereby be maintained only in that state. In this case, oscillation having the maximum gain is selected however small the difference in gain may be, so that when a magnetic field is applied to the active layer 61 and reflective layers 64, 65 to produce a difference in gain between right- and left-handed circularly polarized light beam to thereby radiate a laser beam having a larger gain selectively. By reversing the direction of the magnetic field applied to the active layer 61 and reflective layers 64, 65, selection between the right- and left-handed circular radiations is reversed. The radiation from the laser source unit has a small numerical aperture, so that when it is used as it is, miniaturization of the head 9 is difficult. A microlens 72 is formed by ion diffusion on the detection optical system 33 directly bonded to the substrate 32. The microlens 72 temporarily focuses a radiation from the laser source 35 to increase the numerical aperture to thereby miniaturize the head 9. In the recording of information, none of the photodetectors 70, 71 and piezoelectric element 48 is used.

Figure 10:
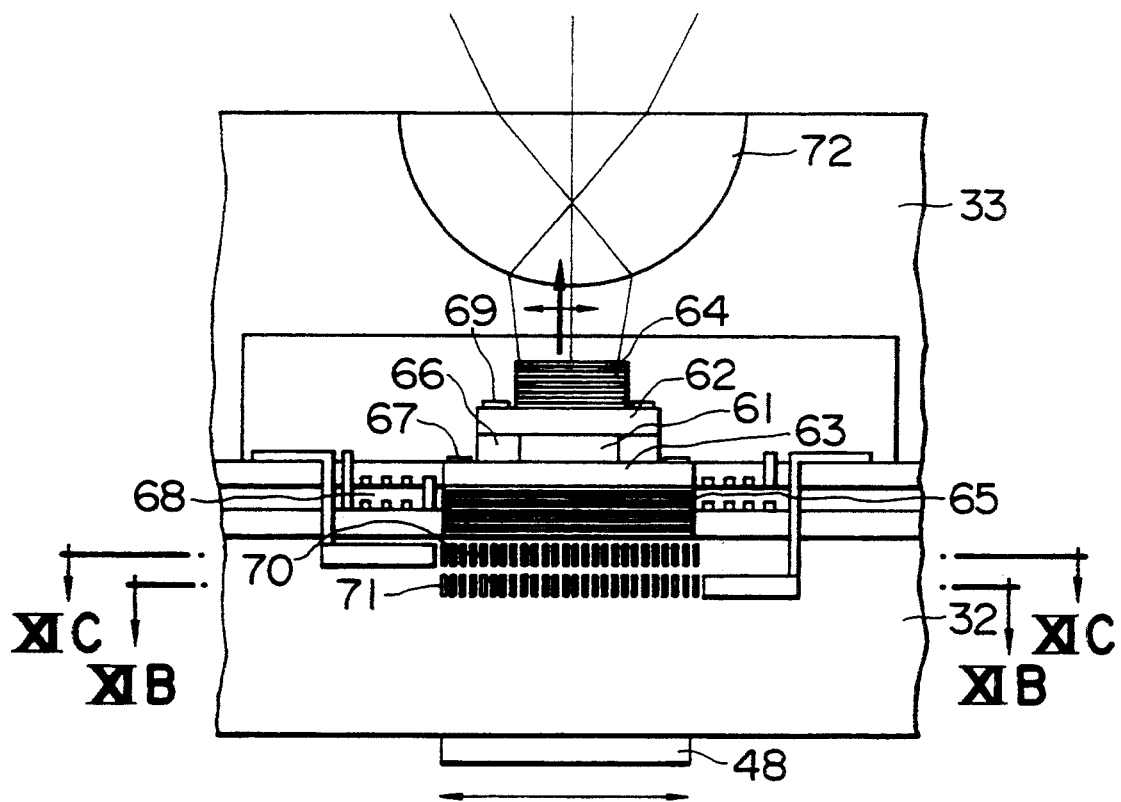
FIG. 10 explains an information reproducing operation of the optical head of FIG. 9.
Figure 11A:
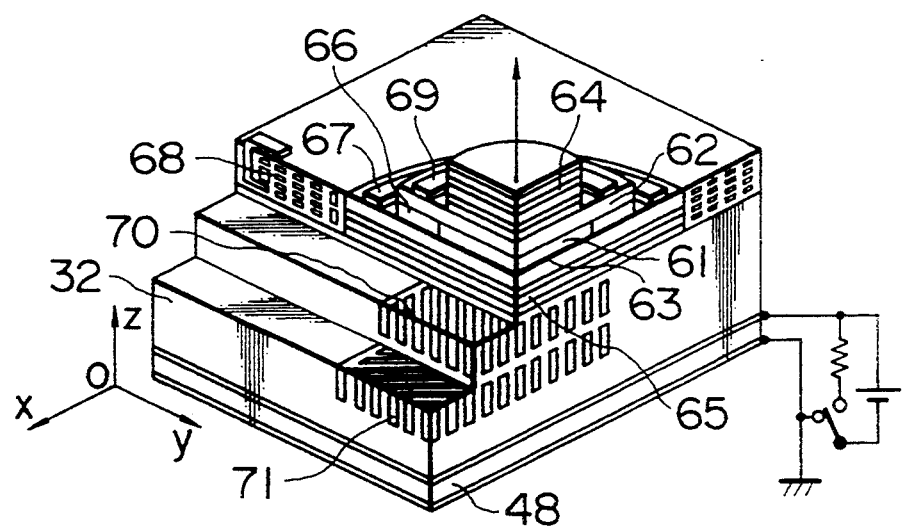
FIG. 11A is a partially cross-sectional perspective view of an optical head as one embodiment of the present invention.

FIG. 10 is an enlarged longitudinal cross-sectional view of the laser source unit 35 of the head of FIG. 9 and illustrates information reproduction. In FIG. 10, since the active layer 61 and the reflective layers 64 and 65 each have an axially symmetric structure, oscillation can occur in any of right- and left-handed circularly polarized light beam modes and also in a linear polarization in any of direction of extension of the plane of FIG. 10 and a direction normal to the plane of FIG. 10. Thus, by increasing the gain of a light beam linearly polarized in a particular direction, a linearly polarized light beam can be radiated. The piezoelectric element 48 is supplied with electric charges, for example, by application of 20–30 d.c. volts thereto, as shown in FIG. 11A, to thereby cause tensile (or compressive) distortions therein in the direction of the arrow. This causes distortions in the substrate 32 to which the piezoelectric element 48 is bonded and hence in the active layer 61 and the reflective layers 64 and 65. Since no electric current flows through the coil 68, no magnetic field is applied to the active layer 61 and the reflective layers 64 and 65. The active layer 61 has different gains in the direction in which the distortions are caused and the direction normal to the former direction. Also, in this case, an oscillation state having a larger gain is selected such that oscillation occurs in the linearly polarized light beam. The direction of the polarization is either parallel or normal to the distortions. In this case, the operation of the laser source unit 35 is substantially the same even when oscillation occurs in any of the linear polarizations. The operations of the detection optical system 33 and the microlens 72 are as described with respect to FIG. 9. Part of the reflected light from the disk 1 enters the photodetectors 70 and 72 through the reflective layer 64, conductive layer 62, active layer 61, conductive layer 63 and reflective layer 65. A change in the direction of polarization of the reflected light is detected by the photodetectors 70 and 71.

As described above, the principles of control of the direction of rotation of the circularly polarized light beam and control of the linearly polarized light beam will be described below.

When a magnetic field is applied to the active layer of the laser source, a difference in energy level occurs depending on the directions of spin of electrons in the active layer. When the structure of the laser source is substantially axially symmetric around the optical axis, the gain of the active layer to the beam has a value different depending on whether the beam is a right- or left-handed circularly polarized one in conformity to the difference in energy level and law of angular momentum conservation. When the laser source oscillates, the mode in which the oscillation occurs is the one which has a maximum gain even if the difference in gain between the mode having the maximum gain and a mode having the second maximum gain is slight. Thus, when the structure of the laser source is axially symmetrical around the optical axis, application of a magnetic field to the active layer produces a circularly polarized light beam while reversal of the magnetic field applied to the active layer reverses the direction of the polarization.

When a mechanical distortion or stress having a unidirection is applied to the active layer of the laser source, the motion of electrons in the active layer and hence the wave function of electrons in the direction of the distortion or stress differ from those in the direction normal to the former direction. Thus, the gain of the active layer to the beam takes a value different depending on whether the direction of polarization of the light is parallel or normal to the distortion or stress. When the laser source starts to oscillate, the mode where the oscillation occurs is the mode which has the maximum gain even if the difference in gain between the mode which has the maximum gain and a possible mode which has the second maximum gain is only slight, as mentioned above. Thus, even when the structure of the laser source is axially symmetrical around the optical axis, a linear polarized light beam polarized in one direction is radiated by application of distortions or stresses to the active layer in one direction normal to the optical axis.

The motional state of electrons in the active layer in the direction of the electric field and hence the wave function of electrons when an electric field is applied to the active layer of the laser source in a particular direction are different from those when the electric field is applied to the active layer of the laser source in the direction normal to the former direction. Thus, the gain of the active layer to the beam takes a value different depending on whether the direction of polarization of the beam is parallel or normal to the electric field. When the laser source starts to oscillate, the mode where oscillation occurs is the mode which has the maximum gain even if the difference in gain between the mode which has the maximum gain and a possible mode which has the second maximum gain is only slight, as mentioned above. Thus, even when the structure of the laser source is axially symmetrical around the optical axis, a linear polarized light beam polarized in one direction is radiated by application of an electric field to the active layer in one direction normal to the optical axis.

Figure 12:
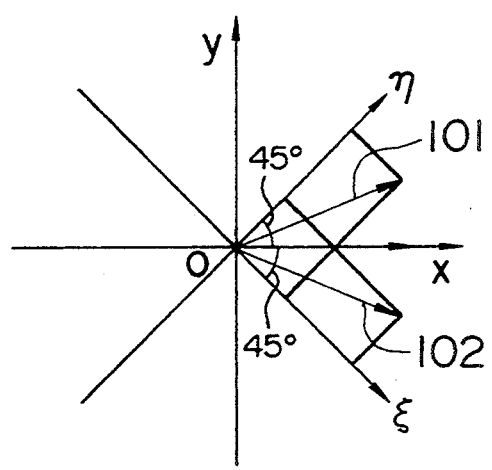
FIG. 12 explains detection of the polarization of a reflected light beam in the optical head of FIGS. 11A-11C.
Figure 11B:
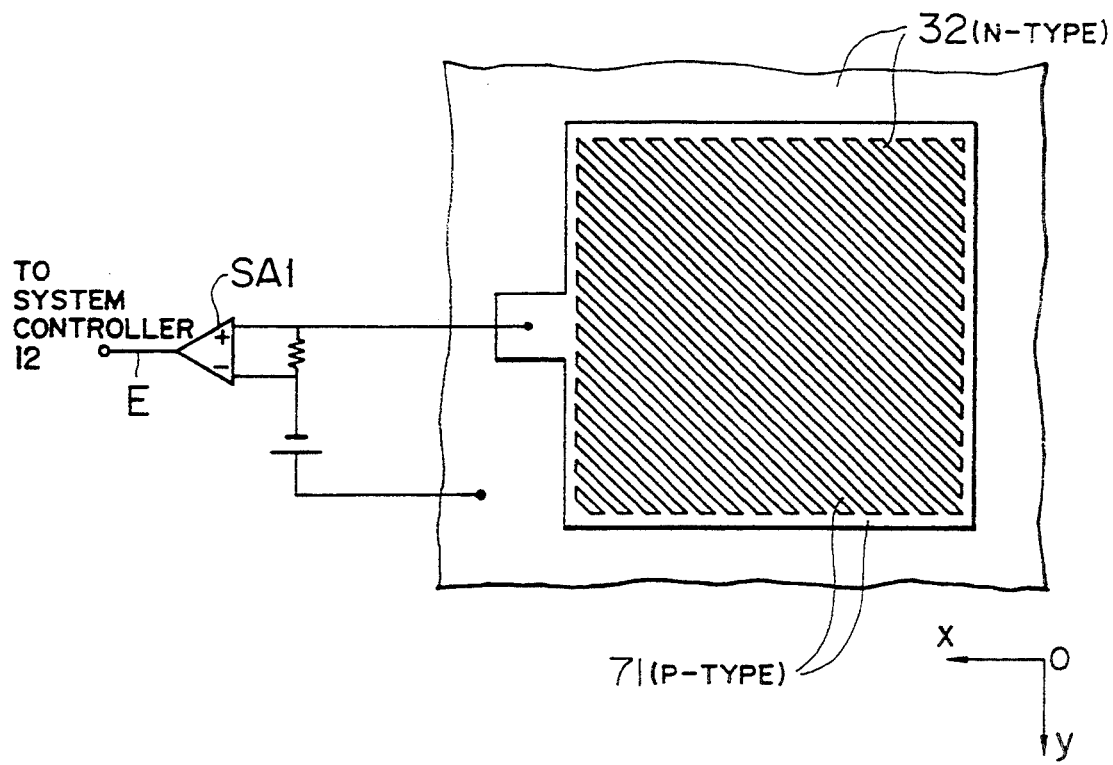
FIGS. 11B and 11C are cross-sectional views taken along the lines XIB—XIB and XIC—XIC, respectively, of FIG. 10.
Figure 11C:
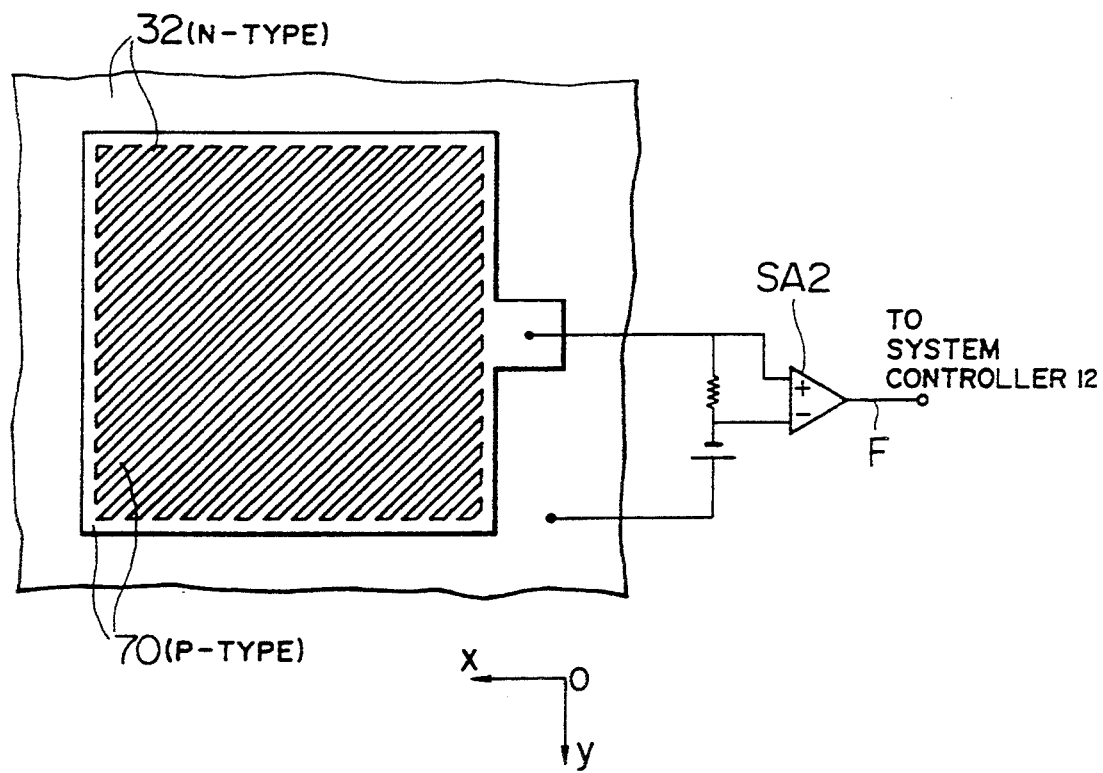

FIG. 11A is a partially cross-sectional perspective view of an optical head and more particularly its light source of one embodiment of the present invention, wherein a tensile distortion is applied to the active layer 61 in the x-axis direction in FIG. 11A. The radiated beam is a linearly polarized one polarized in either one of the x- and y-axis directions. Even when the beam is polarized in any of those directions, it operates in substantially the same manner. Therefore, the operation will be described below on the assumption that the beam is polarized in the x-axis direction. The substrate 32 is made of an n-type semiconductor and the photodetectors 70, 71 are each made of a p-type semiconductor such that a pn junction is formed, which operates as a photodiode. The photodetectors 70, 71 are especially shown in FIGS. 11B and 11C which are cross-sectional views taken along the lines XIB—XIB and XIC—XIC, respectively. The motional state of electrons in a direction parallel to the pn junction is different from that in a direction normal to the former direction. The sensitivity of the photodiode also takes a value different depending on whether the direction of polarization of the incident beam is parallel or normal to the pn junction. Which of the sensitivities of the photodiode obtained when the directions of polarization of the incident beam are parallel and normal to the pn junction is larger varies depending on the composition of the semiconductor, the magnitude of the reverse bias and the wavelength of the incident beam. What is important here is that there is a difference between them and it does not matter which is larger. Description will be made here on the assumption that the sensitivity is larger when the direction of the polarization is normal to the pn junction plane than when it is parallel to the pn junction plane. Even when the assumption is reverse, the photodetectors 70, 71 each operate in substantially the same manner as mentioned above. In the photodetectors 70 and 71, the pn junction planes are normal to the $\xi$ and $\eta$ axes, respectively, in FIG. 12. (The $\xi$ and $\eta$ axes are normal to each other and at angles $+45°$ and $-45°$ with respect to the X axis, respectively.) When the direction of polarization of the beam incident to the photodetectors 70, 71 is parallel to the x axis, the angles between the respective pn junction planes of the photodetectors 70 and 71 and the direction of polarization of the incident beam are equal and the sensitivities of the photodetectors to the light beam are the same. The beam reflected by the disk 1 is polarized in the direction shown by a vector 101 or a vector 102 of FIG. 12 depending on whether the magnetization of the magnetic film on the disk 1 is upward or downward. The angle between the direction shown by the vector 101 and the pn junction plane of the photodetector 71 is closer to right angles than the angle between the direction shown by the vector 101 and the pn junction plane of the photodetector 70. Thus, the photodetector 71 is higher than the photodetector 70 in the sensitivity to the beam polarized in the direction shown by the vector 101. Similarly, the photodetector 70 is higher than the photodetector 71 in the sensitivity to the beam polarized in the direction shown by the vector 102. By comparison of the outputs from the photodetectors 70 and 71, the direction of polarization of the reflected beam from the disk 1 can be detected and hence reproduction of information is achieved.

Reference numerals SA1 and SA2 denote differential amplifiers which amplify the outputs from the detectors 70, 71 and the amplified outputs E, F from the amplifiers SA1 and SA2 are fed to the system controller 12 which provides a reproduced output on the basis of the result of the operation (E-F).

Figure 13:
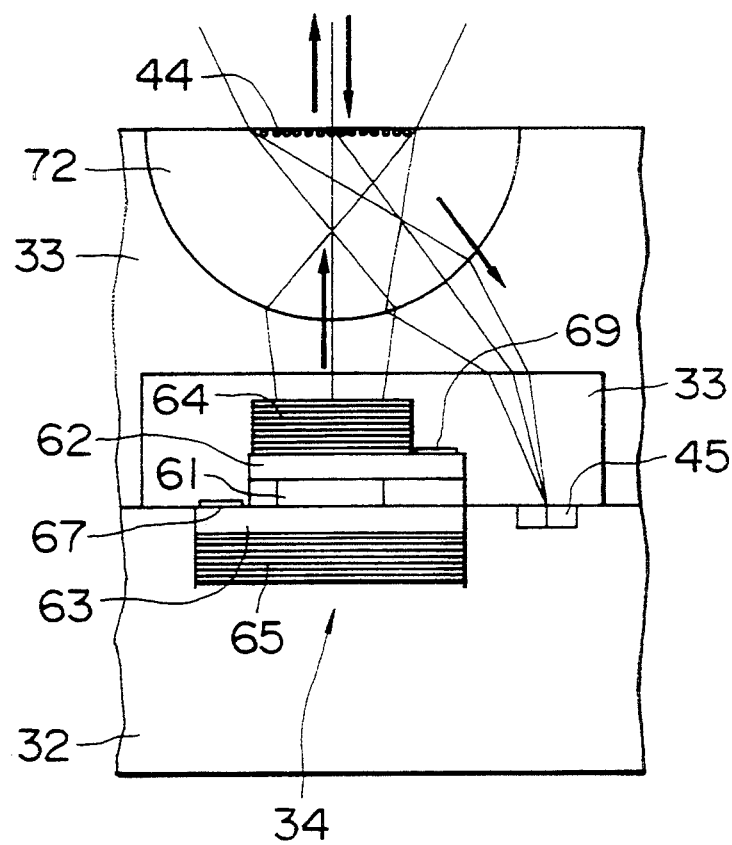
FIG. 13 is a cross-sectional view of an optical head as one embodiment of the present invention.

FIG. 13 is a longitudinal cross-sectional view of an optical head as one embodiment of the present invention and shows a laser source unit 34, photodetector 45, and diffraction grating 44. A laser source unit 38, photodetector 47, and diffraction grating 46 are the same in structure as the laser source unit 34, photodetector 45, and diffraction grating 44, respectively. The laser source unit 34 is the same in structure as the laser source unit 35 except that the former has no coil which produces a magnetic field and that the active layer 61 and reflective layers 64, 65 take the form of an ellipse. Since the structure is not axially symmetrical, the radiated beam is a linearly polarized radiation polarized in the direction of extension of a longer axis or a shorter axis of the ellipse. The radiation from the laser source unit 34 is temporarily focused by a microlens 72 provided on the detection optical system 33 and then radiated with an increased angle of radiation. Part of the beam reflected from the disk 1 is diffracted by the diffraction grating 44 to be focused at the position of the detector 45.

Figure 14:
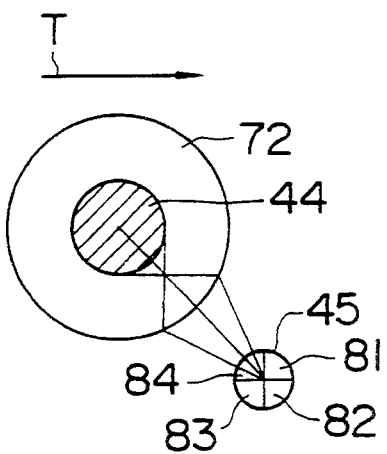
FIG. 14 explains a diffraction grating and a photodetector of the optical head of FIG. 13.
Figure 15:
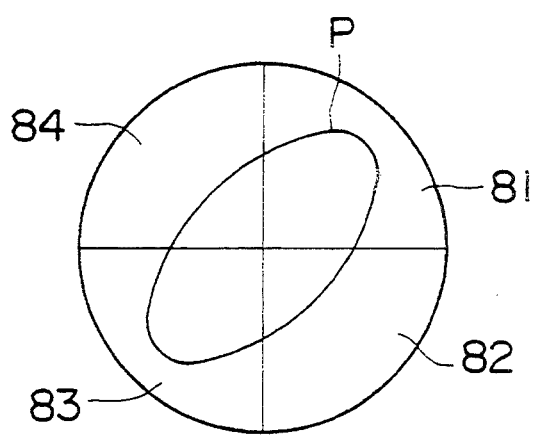
FIGS. 15 and 16 each illustrate a spot pattern on the photodetector of a laser source.
Figure 16:
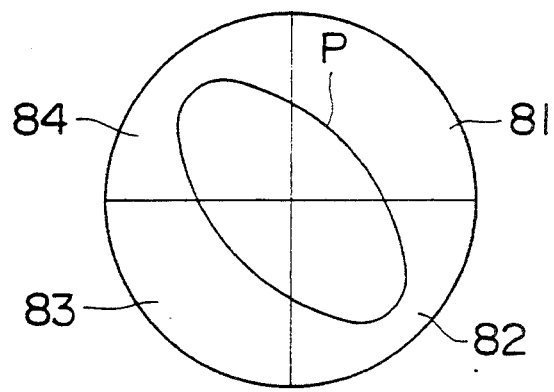

As shown in FIG. 14, the grating 44 is provided at an angle of about 45 degrees to the direction of extension of a track T. As shown in FIG. 14, the photodetector 45 is composed of four photodiodes 81–84. The beam diffracted by the grating 44 has an astigmatism. Thus, when the disk 1 is remote from the objective, a pattern of a spot P such as that shown in FIG. 15 is obtained while when it is closer to the objective, a pattern of a spot P such as that shown in FIG. 16 is obtained. Thus, by performing the operation $(a+c)-(b+d)$ where a, b, c and d are the respective outputs from the photodiodes 81–84, a focusing error signal is obtained. A regular magneto-optical disk is provided with groove-like tracks. Thus, when the spot deviates from the tracks, quantities of the beam incident to the photodiodes 82, 83 change relative to those of the beam incident to the photodiodes 81, 84 due to diffraction at the groove-like tracks. Therefore, by performing the operation $(b+c)-(a+d)$, a track error signal is obtained.

Figure 17:
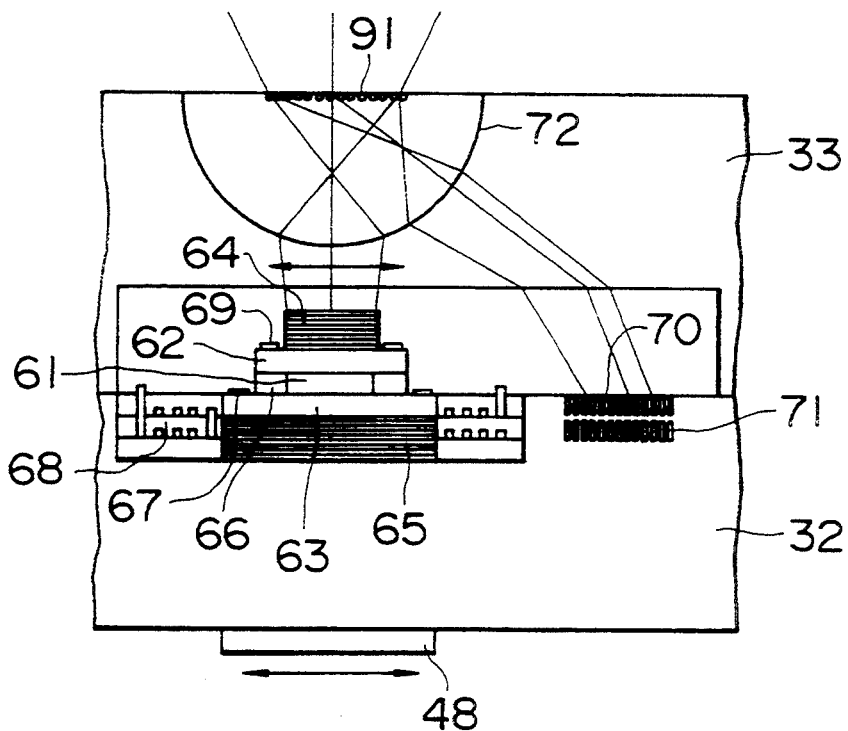
FIG. 17 is a longitudinal cross-sectional view of an optical head as one embodiment of the present invention.

FIG. 17 is a cross-sectional view of an optical head as one embodiment of the present invention. In FIG. 17, the active layer 61, conductive layers 62, 63, reflective layers 64, 65, electrodes 67, 69, coil winding 68, insulating layer 66, and piezoelectric element 48 are the same in structure and operation as the corresponding ones of the embodiment of FIGS. 9 and 10 except that the photodetectors 70, 71 are provided not below the reflective layer 65, but on an upper surface of the substrate 32 and that a diffraction grating 91 which diffracts the beam reflected from the disk 1 is provided in the detection optical system 33. In this case, when the direction of diffraction of the beam by the diffraction grating 91 is beforehand coincident with the extension of the tracks, the spacing between any laser source units is reduced.

Figure 18:
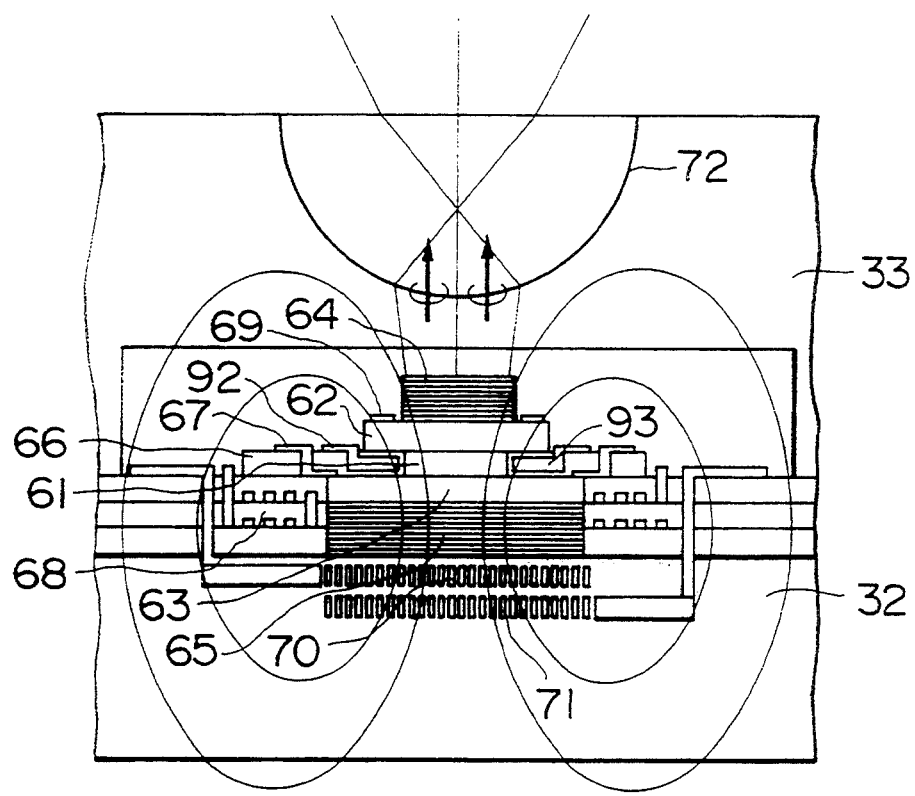
FIG. 18 is a cross-sectional view of an optical head as one embodiment of the present invention and explains its information recording operation.
Figure 19:
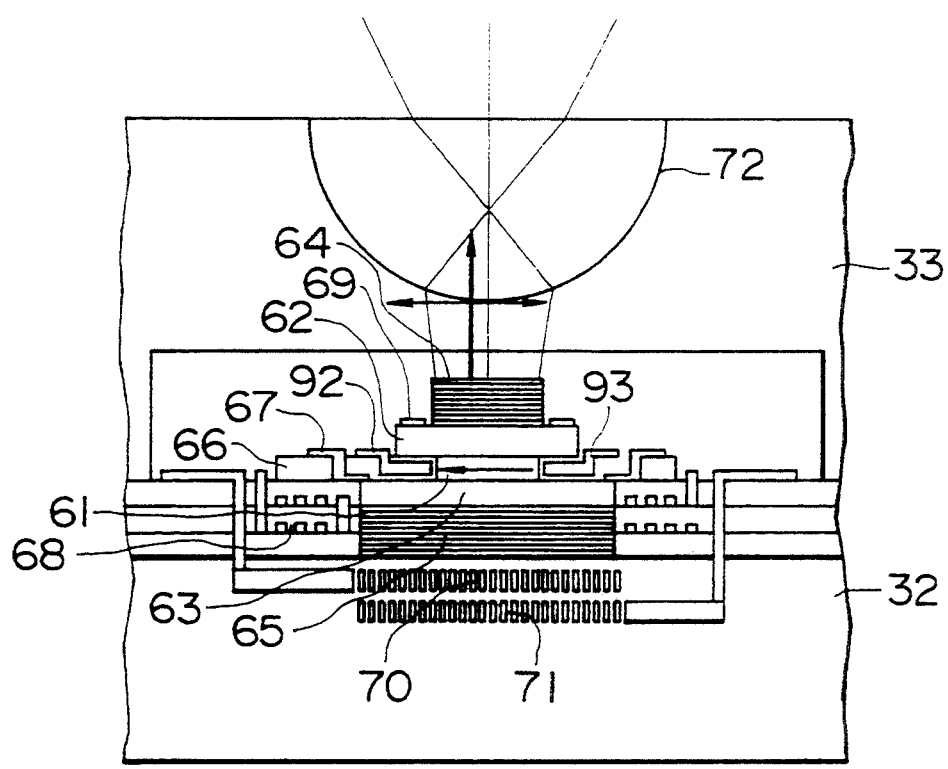
FIG. 19 is a longitudinal cross-sectional view of the optical head of FIG. 18 and explains its information reproducing operation.

FIGS. 18 and 19 each are a cross-sectional view of an optical head as one embodiment of the present invention. FIG. 18 illustrates the operation of recording by the head. In FIG. 18, the active layer 61, conductive layers 62, 63, reflective layers 64, 65, electrodes 67, 69, and coil winding 68 are the same in structure as the corresponding ones of the embodiments of FIGS. 9 and 10 except that no piezoelectric element 48 is provided and that the electrodes 92 and 93 are embedded in the insulating layer 66. In the recording of information, no potential difference is applied across the electrodes 92 and 93 and an electric current flows through the coil 68 to apply a magnetic field to the active layer 61 and reflective layers 64 and 65. By switching the direction of a current flowing through the coil 68, the direction of polarization of the radiated light beam is switched between the right- and left-handed circularly polarized ones.

Figure 20:
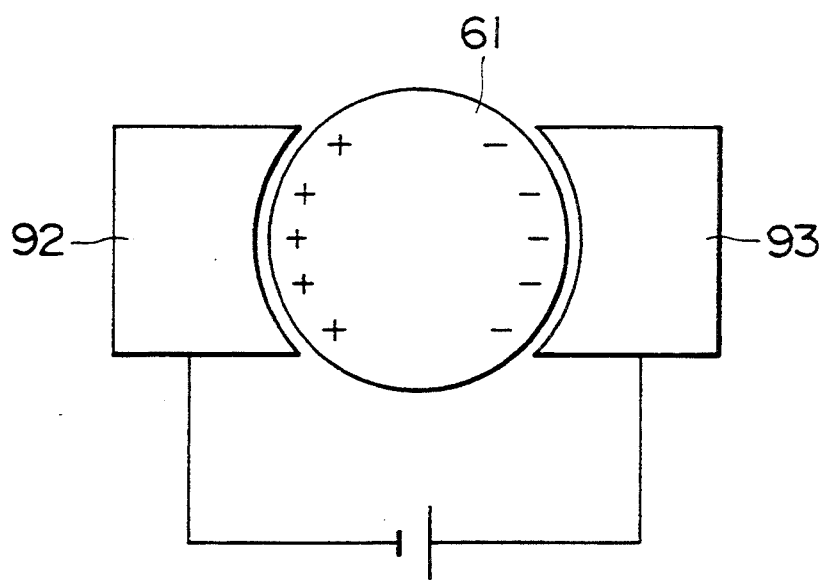
FIG. 20 is an enlarged cross-sectional view of an active layer of a laser source in one embodiment of the present invention.

FIG. 19 illustrates the reproduction of information. In this case, no electric current flows through the coil 68, a potential difference, for example of 2-3 volts, is applied across the electrodes 92 and 93, and an electric field is applied to the active layer 61. As shown in FIG. 20, when a minus and a plus potential are applied to the electrodes 92 and 93, respectively, electrons and holes in the active layer 61 are drawn toward the electrodes 93 and 92, respectively, so that uneven carrier distribution occurs. Thus, the wave function of electrons in the direction in which the electric field is applied is different from that in the direction normal to the former direction. In this case, the gain of the active layer 61 to the beam varies depending on whether the direction of the polarization is parallel or normal to the direction of the electric field, and a linearly polarized light beam having a higher gain is radiated. The system of detecting the direction of polarization of the reflected beam from the disk 1 is the same as that in the embodiments of FIGS. 10 and 11.

As described above, according to the embodiment of the present invention, the laser source which radiates a circularly polarized light beam includes means for controlling the rotational direction of the circular polarization by applying a magnetic field to the active layer and reflective layers in the direction of its optical axis to cast the circularly polarized light beam on a recording layer of the disk to reverse the magnetization to thereby write information, means for applying a stress or mechanical distortion on the source in a direction normal to its optical axis to read out information by casting a circularly polarized light beam as a linearly polarized light beam on the disk. Thus, the speed of recording and reproducing information is increased. Since the above means is disposed in the laser source, the number of components is greatly decreased and the laser source is miniaturized.

While in the embodiment the coil is provided in the laser source as means for applying a magnetic field, a permanent magnet may be provided rotatably in the laser source such that the magnet is rotated to change the direction of the magnetic field.

Figure 21A:
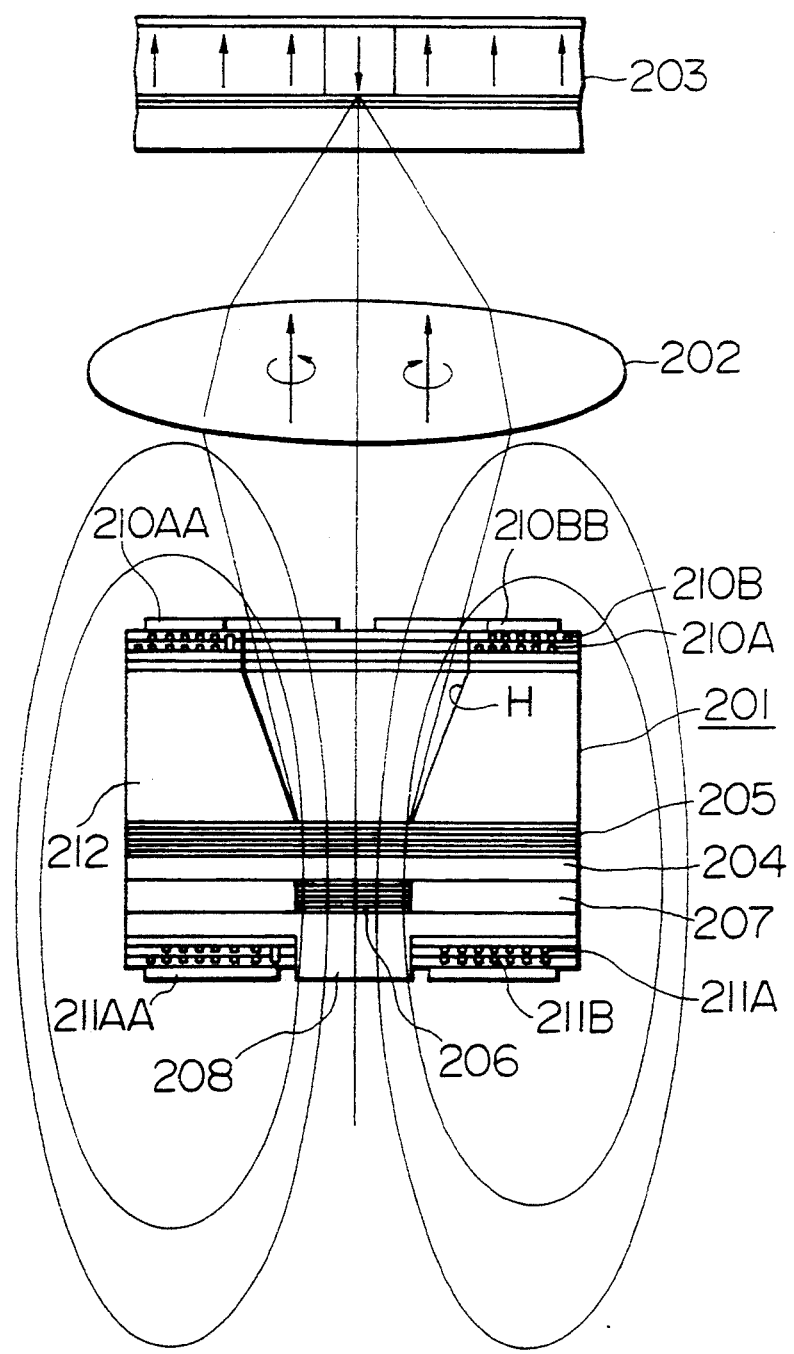
FIG. 21A is a diagrammatic view of an optical head as one embodiment of the present invention.
Figure 21B:
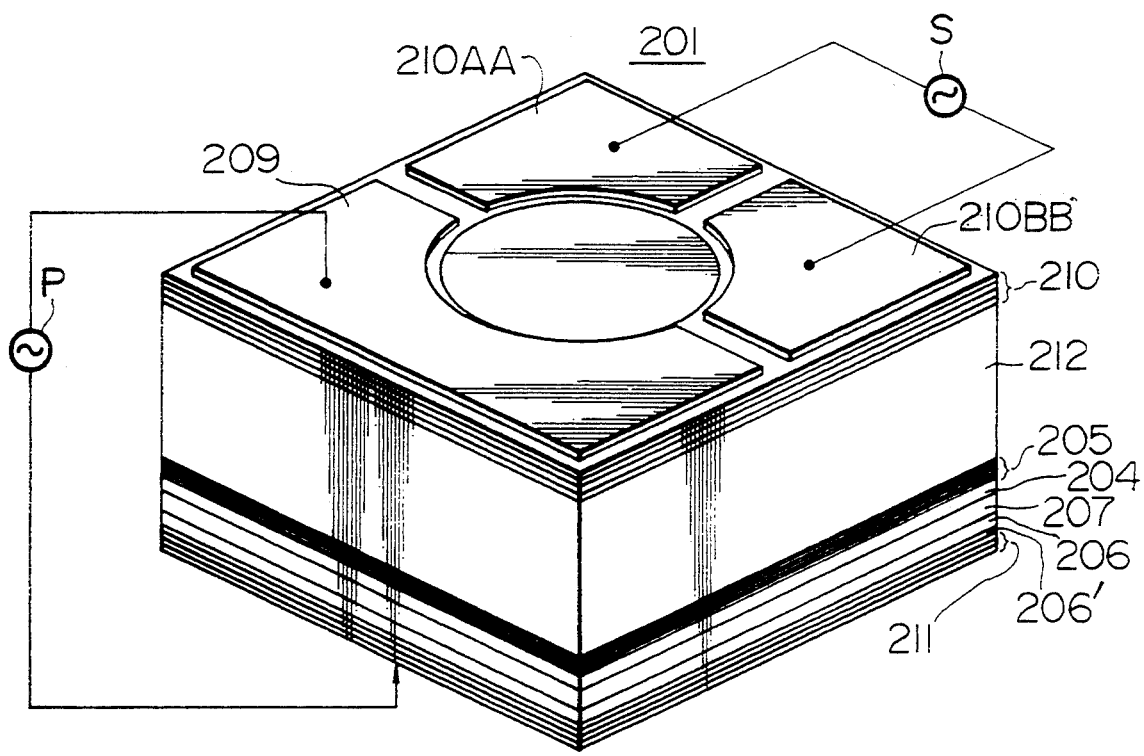
FIGS. 21B and 21C each are a perspective view of a laser source of the optical head of FIG. 21A.
Figure 21C:
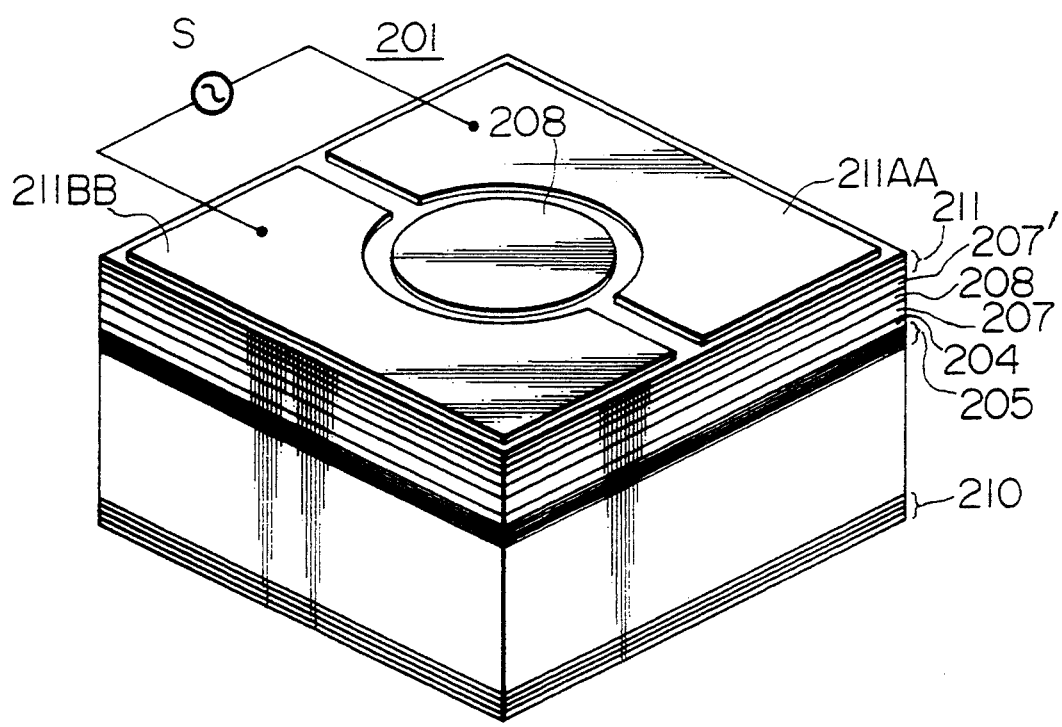
Figure 22:
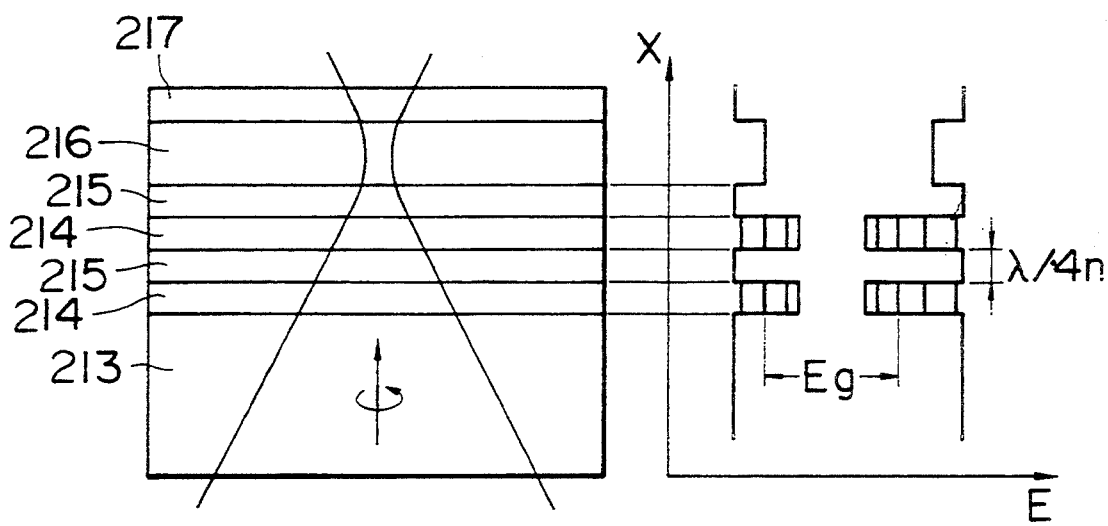
FIG. 22 is a cross-sectional view of a magneto-optical disk of one embodiment of the present invention and its energy band diagram.
Figure 23A:
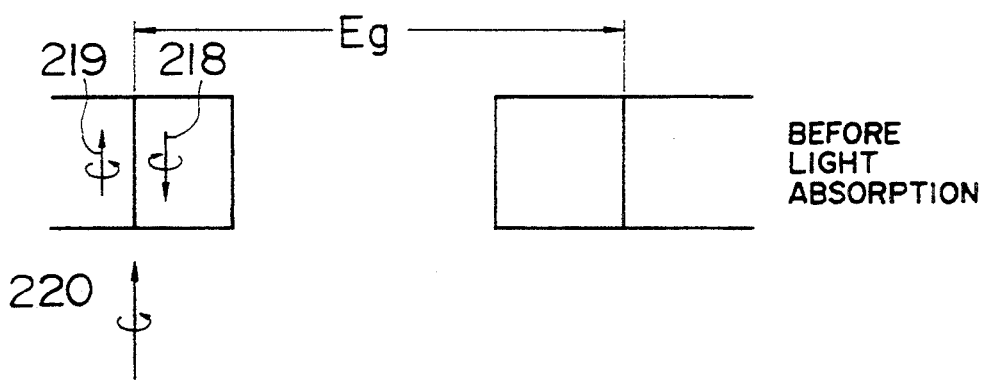
FIGS. 23A and 23B each are a partially enlarged view of the energy band structure of FIG. 22.
Figure 23B:
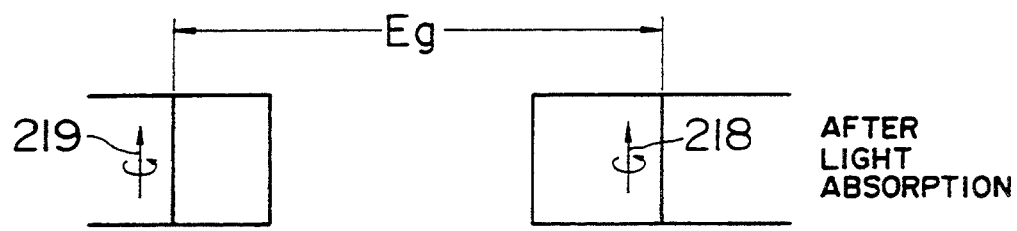

Other embodiments of the present invention will be described with respect to FIGS. 21A-21C, 22, 23A and 23B. FIGS. 21A-21C diagrammatically illustrate the structure of the optical head and the principles of its operation. FIGS. 21B, 21C each are a perspective view of a laser source the cross section of which is shown in FIG. 21A. FIG. 22 is an enlarged cross-sectional view of the magneto-optical disk and an energy band diagram concerned. FIGS. 23A, 23B each are a partial enlarged view of FIG. 22.

As shown in FIG. 21A-21C, an active layer 204 is sandwiched between Bragg reflectors 205 and 206 which are made of corresponding semiconductor multilayers different in composition. The thicknesses and compositions of the Bragg reflectors 205 and 206 are selected such that Bragg reflection of radiations from the active layer 204 occurs. The Bragg reflectors constitute a resonator. A power supply P supplies an electric current to the active layer 204 through electrodes 208, 209, a substrate 212, Bragg reflectors 205, 206 to thereby cause the active layer 204 to emit a beam. The current is collected by an insulating layer 207 to the center of the active layer 204 and beam emission occurs mainly at the point where the current is collected. The beam radiated from the active layer 204 resonates with the resonator composed of the reflectors 205 and 206 to provide laser oscillation. Reference numeral 207' denotes an insulating layer.

A laser source 1 is provided with coil windings 210 and 211 through each of which an electric current flows to produce a magnetic field, which acts on the active layer 204 and Bragg reflectors 205, 206 in the optical axis direction. This splits the levels of electron energy in the active layer 204 and Bragg reflectors 205, 206 according to the directions of spin of the electrons. The laser source 1 has a structure of substantially axial symmetry around the optical axis and is capable of radiating both right- and left-handed circularly polarized light beams. The gains of the active layer 204 to the right- and left-handed circularly polarized light beams and the reflectivities of the Bragg reflectors 205, 206 to those light beams are different depending on a difference between the energy levels due to law of angular momentum conservation and the direction of spin of the electrons.

Generally, when a laser source starts to oscillate, its mode of oscillation having a maximum gain survives. Therefore, by application of a magnetic field having an optical axis direction to the active layer 204, the gain of a particular mode is increased to thereby emit a circularly polarized light beam having a particular direction. Furthermore, by reversing the direction of the magnetic field, reverse selection is made between the right- and left-handed circularly polarized light beams. That is, as shown in FIGS. 21B and 21C, by connecting a signal source S across electrodes 210A and 210B connected to the coil winding 210 and a signal S across electrodes 211A and 211B connected to the coil winding 211, respective light beams modulated with the signal are radiated. The light beams radiated from the laser sources 1 are each focused by an objective 202 and cast on the magneto-optical disk 203.

FIG. 22 is a cross-sectional view of the disk 203 and shows the structure of energy bands. In FIG. 22, the axis of ordinate of the band diagram is a coordinate axis normal to the disk face while the axis of abscissa represents electron energy. The right- and left-hand energy levels represent a conduction band and a valence band, respectively. Provided on a transparent baseplate 213 are a multi-film composed of alternately superposed thin semiconductor films 214 and thin dielectric films 215 (practically, 1-6 superposed periodic layers of films 214 and 215), a magnetic film 216, and a protective film 217. The thin semiconductor film 214 has a thickness thin enough to have a quantum well structure and determined such that the light beam radiated from the laser source 201 resonates with a pair of energy gaps Eg involving levels between which no transition is inhibited. The thickness of the film 214 is, for example, 4–5 nm, which is by far thinner than the wavelength (about 350–750 nm) of a regular laser beam. In order to improve the absorption of the beam by the semiconductor film 214, the thickness of the thin dielectric film 215 is selected so as to be one fourth of the wavelength of the light beam radiated from the laser source 201 with which wavelength the beam propagates, i.e., $\lambda/4$ n, where n is the refractive index of the dielectric (for example, $SiO_2$ has n=1.45) and $\lambda$ is the wavelength of the beam in a vacuum space. This increases the absorptivity of the light beam by the semiconductor film 214 since the thickness of the thin semiconductor film 214 is sufficiently thin compared to the wavelength of the irradiated light beam. The thickness d of the semiconductor film to cause the resonance (irrespective of whether a dielectric or a semiconductor having another composition is provided between any adjacent films 214 and 215) is given by $$d = n \sqrt{\frac{\hbar^2 \pi^2 (m_e^* + m_h^*)}{2 m_e^* m_h^* \left( \frac{2\pi c \hbar}{\lambda} - E_o \right)}}$$

where $\hbar = h/2$ where h is Planck's constant $= 6.6 \times 10^{-34}$ J·S $m_E^*$ is the effective mass of an electron in the conduction band, and in the case of Si, $m_e^* = 0.98$ me where me is the mass of an electron which is $9.1 \times 10^{-31}$ kg;

$m_h^*$ is the effective mass of a hole in the valence band and in the case of Si, $m_h^* = 0972$ 0.52 me;

c is the velocity of light in vacuum = $3.00 \times 10^8$ m/s;

k is the wavelength of a light beam incident to the disk and in vacuum;

n is a natural number (1, 2, 3, . . . ); and $E_0$ is a band gap and in the case of Si, the band gap is $1.76 \times 10^{-19}$ J.

Thus, when a light beam having a wavelength of 780 mm enters a Si semiconductor film 214, its thickness d which starts oscillation is:

$d = n \times 1.50 \times 10^{-9}$ m.

When the thickness is 1.50 nm times a natural number, i.e., 1.50, 3.00, 4.50 nm, . . . , the Si semiconductor film resonates with a light beam having a wavelength of 780 μm.

FIGS. 23A, 23B each are an enlarged view of the energy band of FIG. 22 and shows the state of absorption of a light beam in the thin semiconductor film 214. Consider only a set of levels which causes resonance with a light beam radiated from the laser source 201. Assume also that a single electron 219 having an upward spin and a single electron 218 having a downward spin are present at the level of the valence band. Further, assume that a circularly polarized light beam 220 enters the valence band. The light beam 220 has an angular momentum or spin. For example, as shown in FIG. 23A, when a light beam 220 having an upward spin enters, it is absorbed by an electron 218 having a downward spin in the valence band such that the electron is excited to the conduction band. At this time, the spin of the excited electron 218 becomes upward in accordance with law of angular momentum conservation. The electron 219 is not excited in accordance with law of angular momentum conservation. Before the light beam is absorbed, electrons having an upward spin are equal in number to electrons having a downward spin, as shown in FIG. 23A, while after the light beam is absorbed, the number of electrons having an upward spin increase by two each time a single electron is excited, as shown in FIG. 23B. Since electrons have negative electric charges, the upward spin becomes a downward magnetic moment. The magnetic moment due to unbalance in the spins magnetizes the semiconductor film to form a magnetic field around the film.

By irradiation of the light beam, the temperature of the magnetic film increases. When it exceeds a Curie point (temperature of transition to a paramagnetic substance), it loses its magnetism. When the light beam becomes weaker and the temperature of the magnetic film is lowered, the direction of magnetization of the magnetic film is determined by the magnetic field of the semiconductor film. When spontaneous magnetization is generated due to a decrease in the temperature of the magnetic film, spontaneous breakage of the symmetry of the system occurs, so that even a weak magnetic field can arrange the directions of magnetization of magnetic domains of the magnetic film. As described above, the spin of an irradiated light beam is switched by switching between the right- and left-handed circularly polarized beams in accordance with the information to be recorded. Switching the direction of the spins results in switching the direction of magnetization generated in the semiconductor film and hence in the magnetic film.

While the embodiments of the multi-layered structure of the dielectric film, for example, of $SiO_2$ or $Si_3N_4$, and the multi-layered film of a semiconductor film has been described, matters similar to what are achieved by those embodiments are achieved even in a semiconductor multi-layered film having a different composition, for example, of Si, Ge or GaAs. Alternatively, a multi-layered film structure having a magnetic film of a quantum well structure may absorb a circularly polarized light beam to switch the direction of the produced magnetization, using this magnetization.

Referring to FIGS. 24A–24H, one example of a method of making the laser source of the optical head of FIG. 21A will be described below.

Figure 24A:
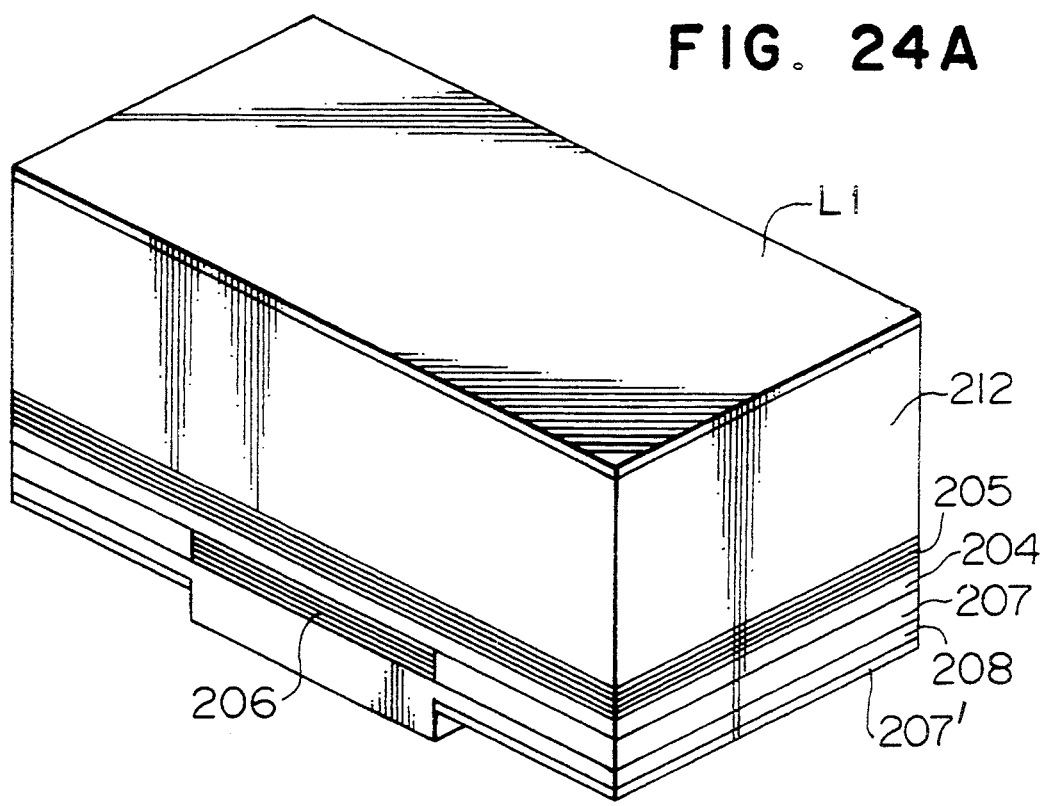
FIGS. 24A-24H illustrate a method of making the laser sources of the magnetic heads of FIGS. 21A-21C.

As shown in FIG. 24A, an Al film L1 having a thickness of about 1 μm is deposited on a semiconductor substrate 212 which constitutes a semiconductor laser structure along with reflective layer 205, active layer 204, reflector layer 206, insulating layer 207, electrode 208, and insulating film 207', using the conventional techniques. The film L1 forms an ohmic contact to the substrate 212.

Figure 24B:
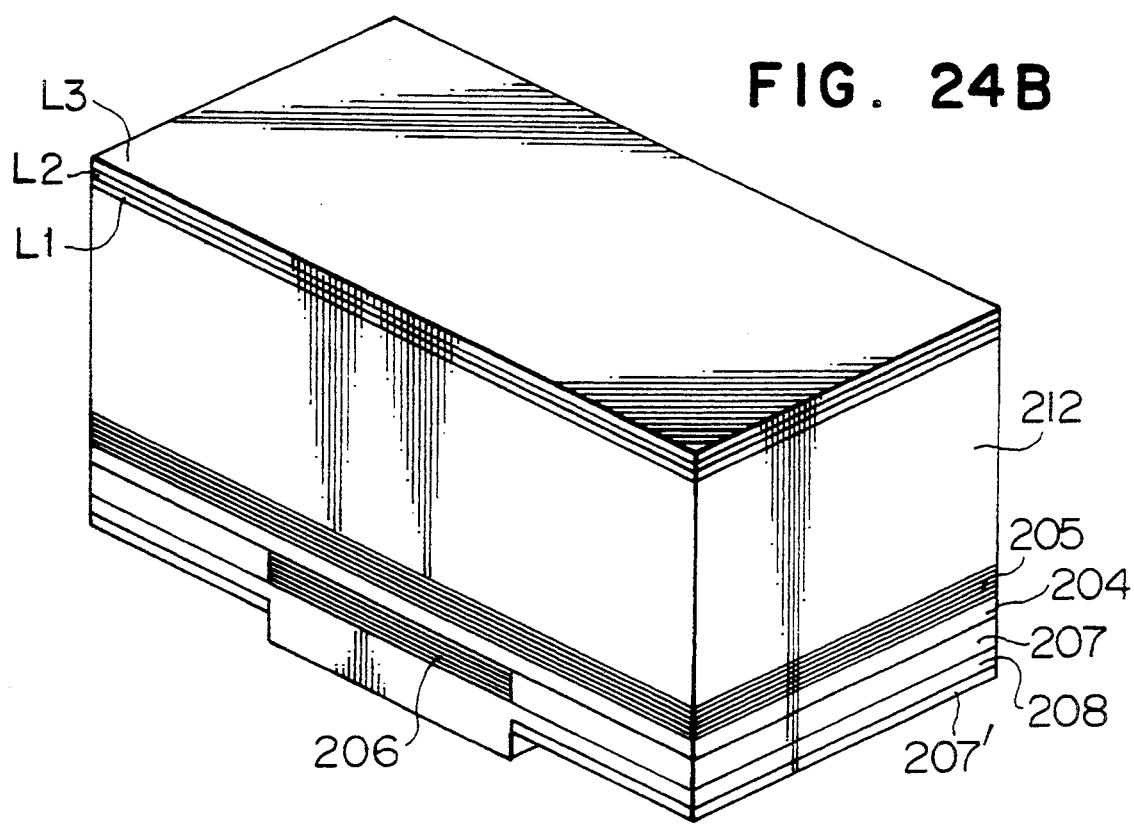

As shown in FIG. 24B, an insulating layer L2, for example, of $SiO_2$ or $SiN_4$ and having a thickness of about 1 μm is formed on the Al film L1, and an Al film L3 having a thickness of about 1 μm is formed on the layer L2.

Figure 24C:
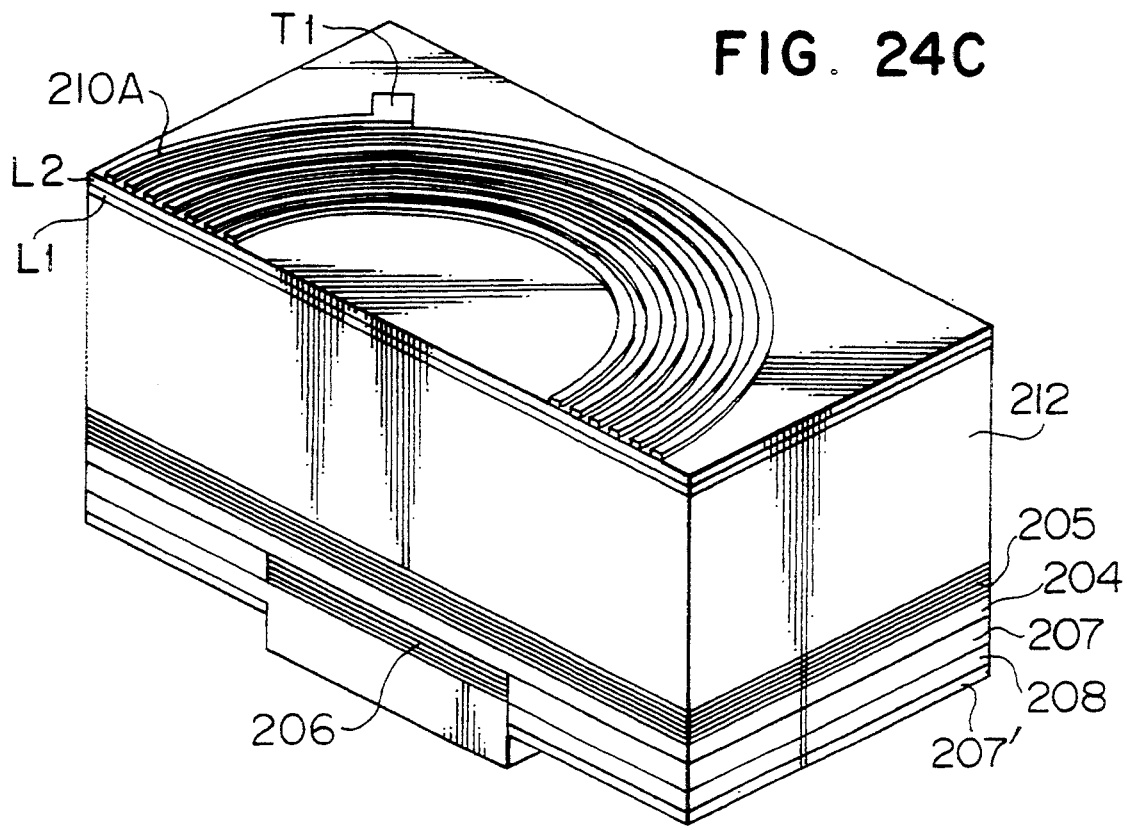

As shown in FIG. 24C, the Al film L2 is etched into a coil winding 210A with a terminal T1.

Figure 24D:
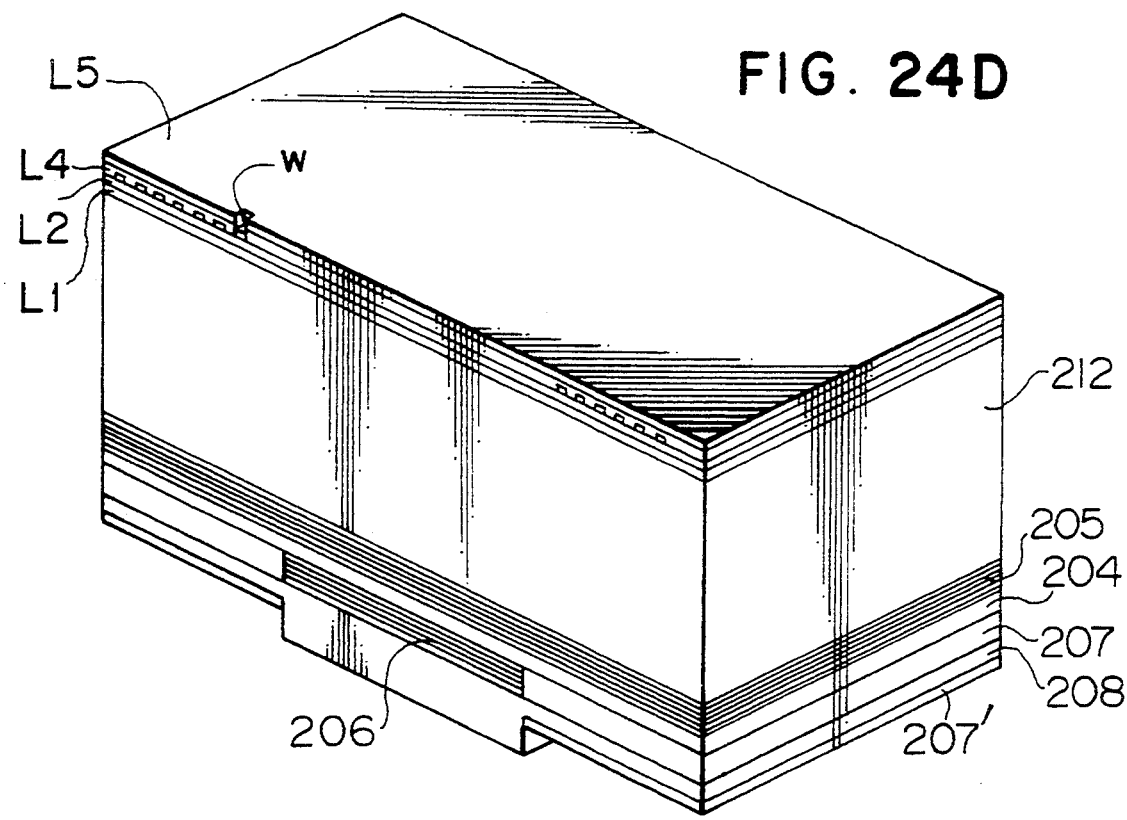

As shown in FIG. 24D, an insulating layer L4 is formed on the insulating layer L2 and coil winding 210A so as to cover the coil winding 210A, and another insulating layer L5 is formed on the insulating layer L4. An opening W is provided for electrical connection to a coil winding 210B to be formed above.

Figure 24E:
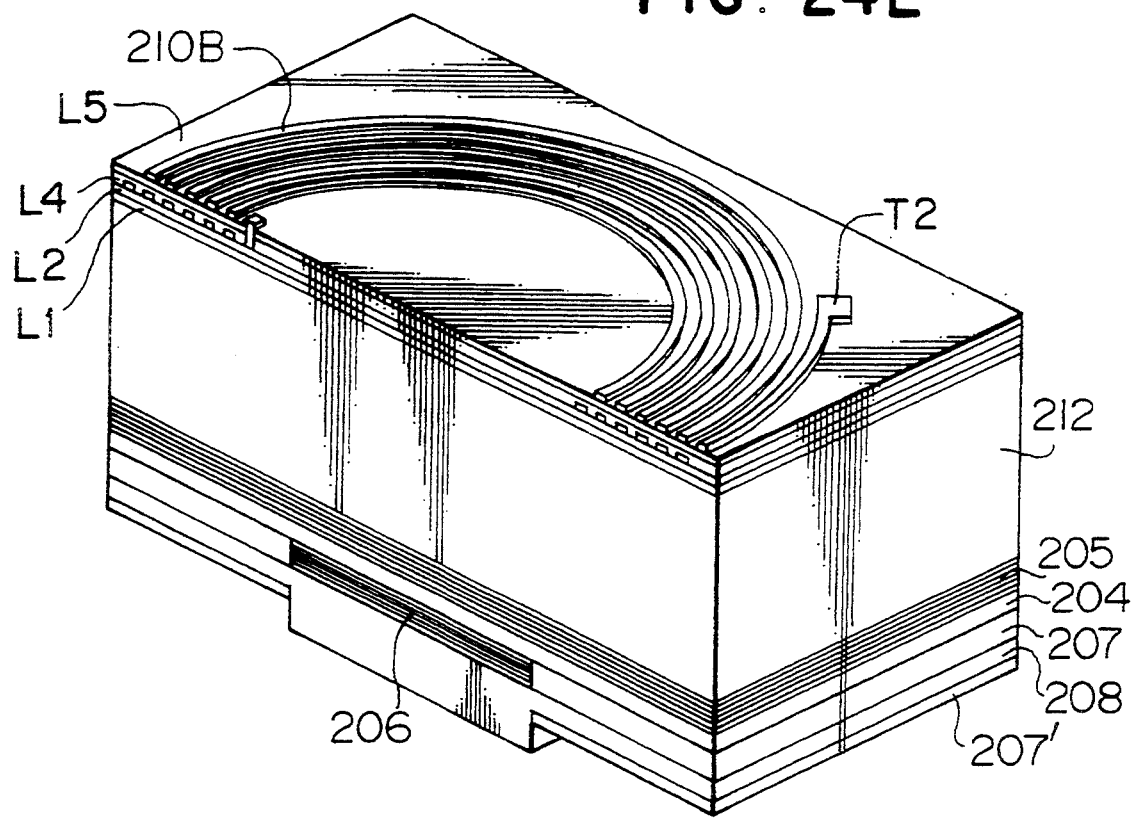

As shown in FIG. 24E, the coil winding 210B with a terminal T2 is then formed on the insulating layer L5 in steps similar to those used for formation of the winding 210A.

Figure 24F:
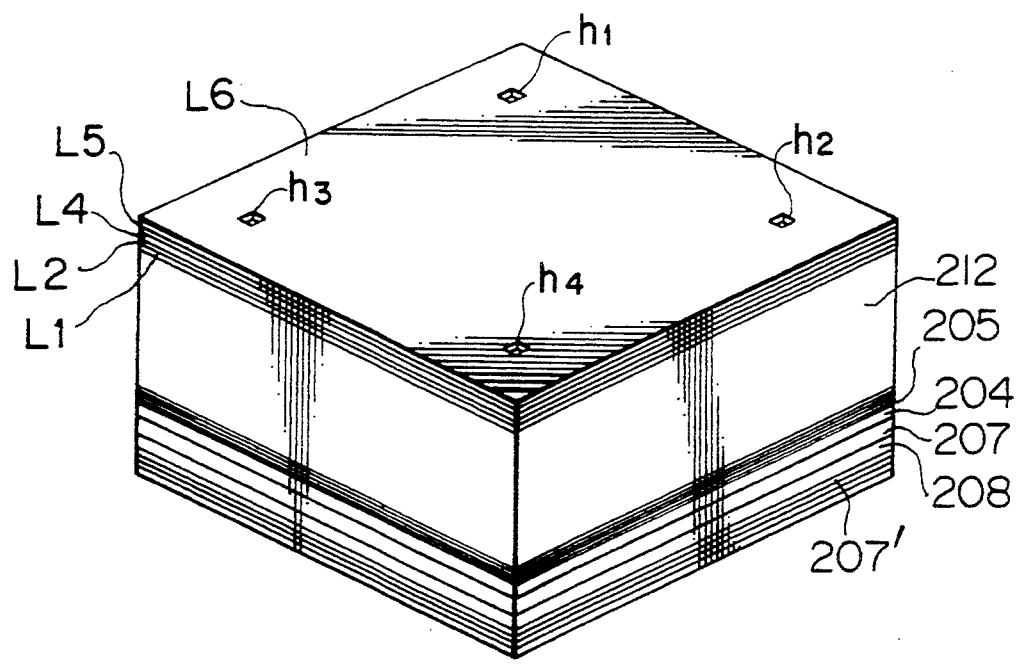

As shown in FIG. 24F, an insulating layer L6 is formed on the insulating layer L5 and coil winding 210B so as to cover the coil winding 210B. Openings $h_1$ and $h_2$ which reach the terminals T1 and T2 of the coil windings 210A and 210B are provided in the layers L4–L6 and L6, respectively. Openings $h_3$ and $h_4$ which reach the Al film L1 are provided.

Figure 24G:
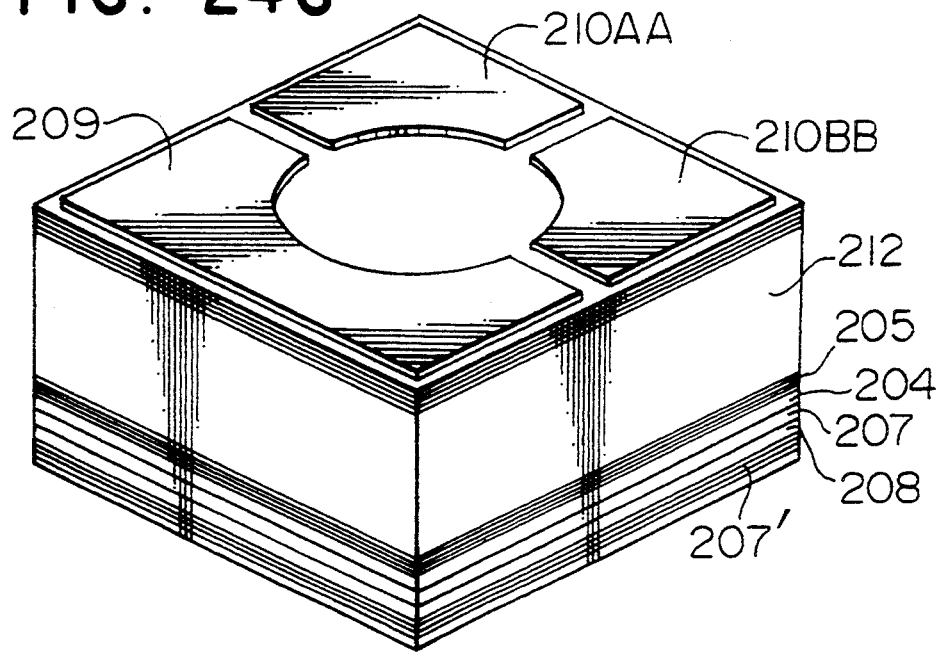

As shown in FIG. 24G, Al is filled into the openings $h_1$–$h_4$, an Al film is deposited on the insulating layer L6 and etched into electrodes 209, 210AA, 210BB, which are electrically connected to the Al film L1, coil winding 210A and coil winding 10B, respectively.

Figure 24H:
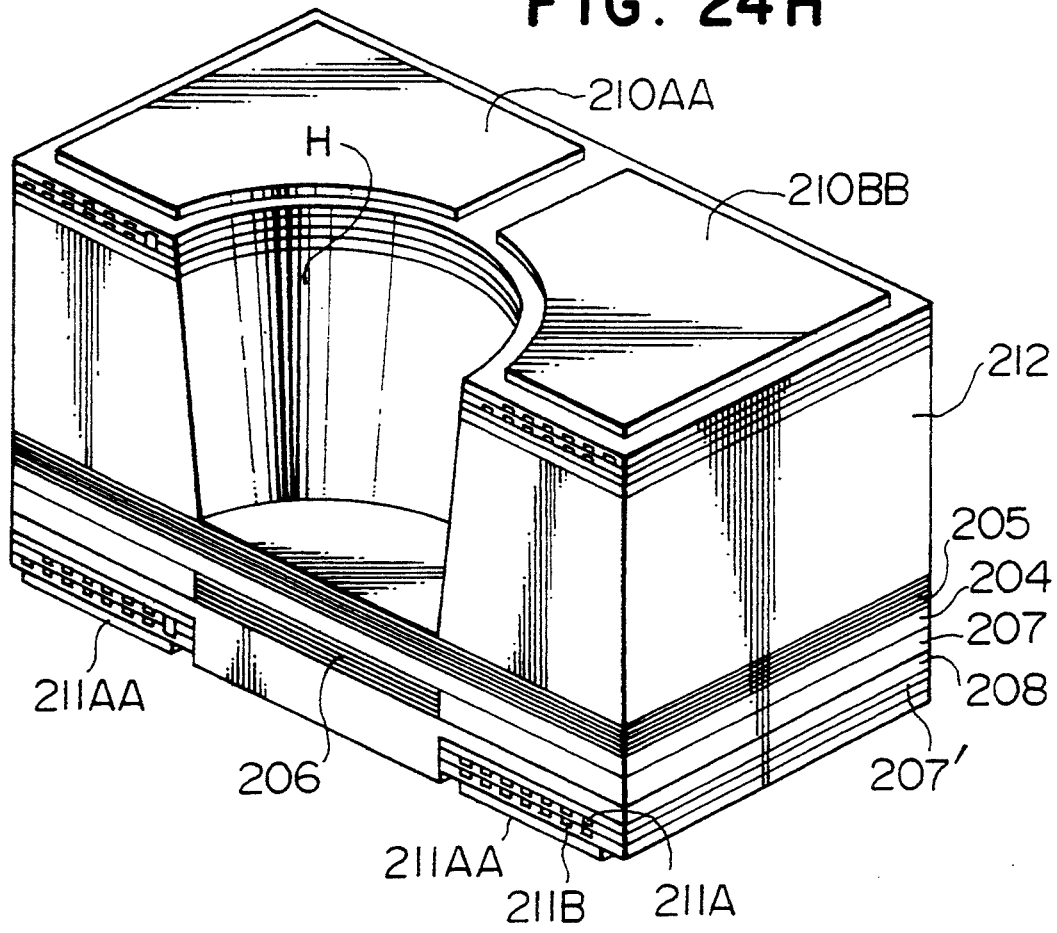

As shown in FIG. 24H, an opening H which reaches the reflective layer 205 is provided through the layers L6, L5, L4, L2 and L1 and the substrate 12.

Coil windings 211A, 211B of FIGS. 24H, 21A, and the electrodes 211AA, 211BB of FIGS. 24H, 21C are also formed in a process similar to that for making the coil windings 210A, 210B and the electrodes 210AA, 210BB, as mentioned above.

Figure 26:
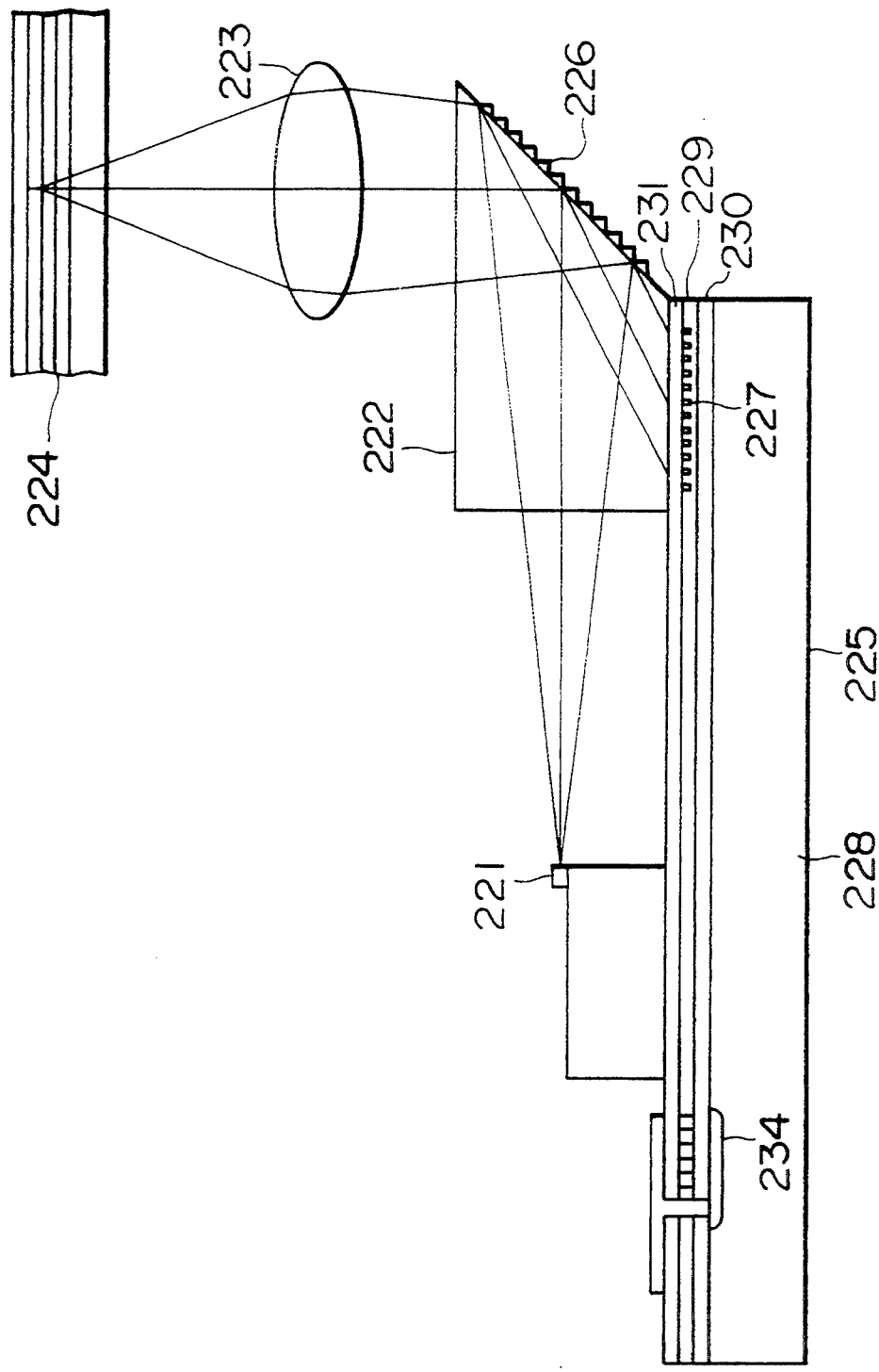
FIG. 26 is a diagrammatic view of an optical head which may be used in the apparatus of FIG. 25.
Figure 27:
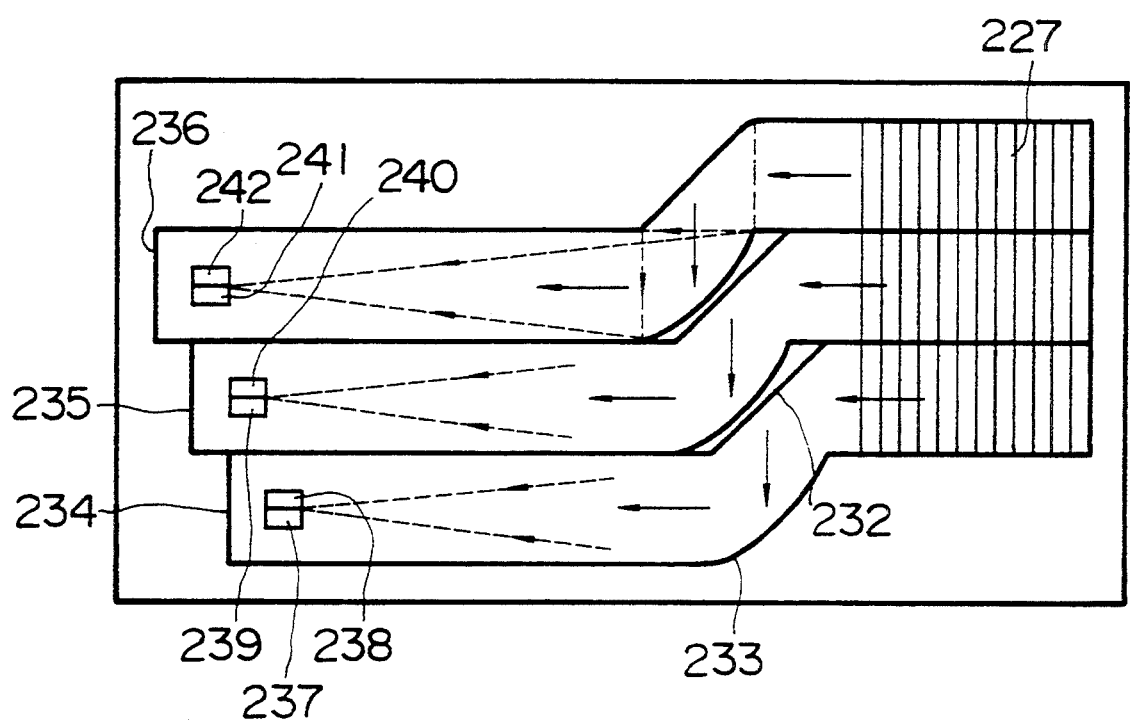
FIG. 27 is a plan view of an optical integrated circuit which constitutes part of the head of FIG. 26.
Figure 28A:
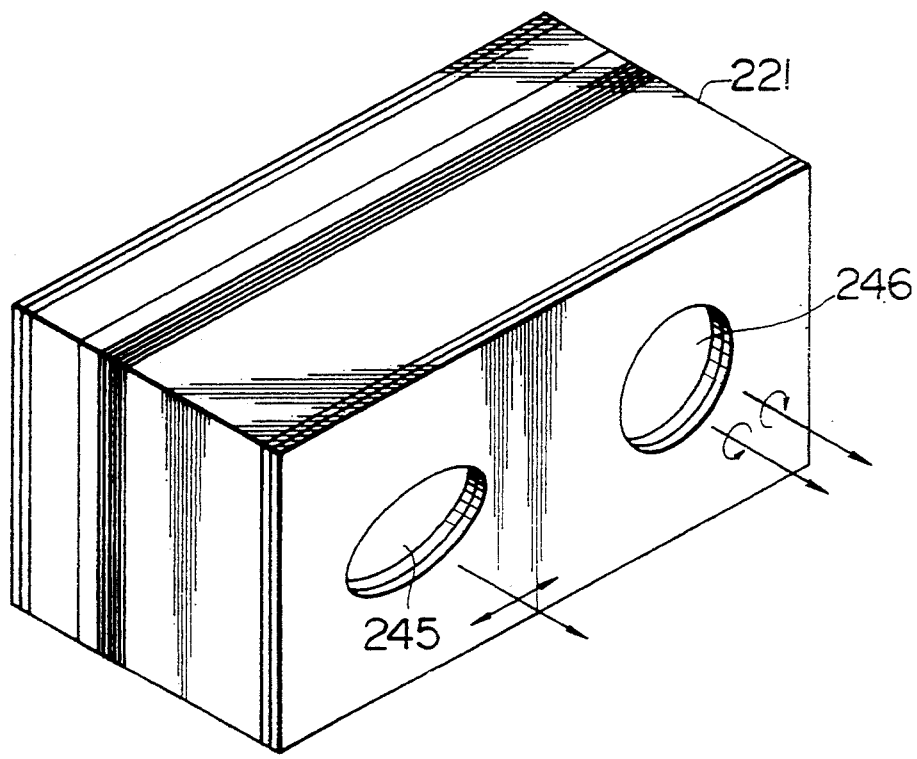
FIGS. 28A and 28B are a perspective view and a cross-sectional view, respectively, of a laser source of an optical head as one embodiment of the present invention.
Figure 28B:
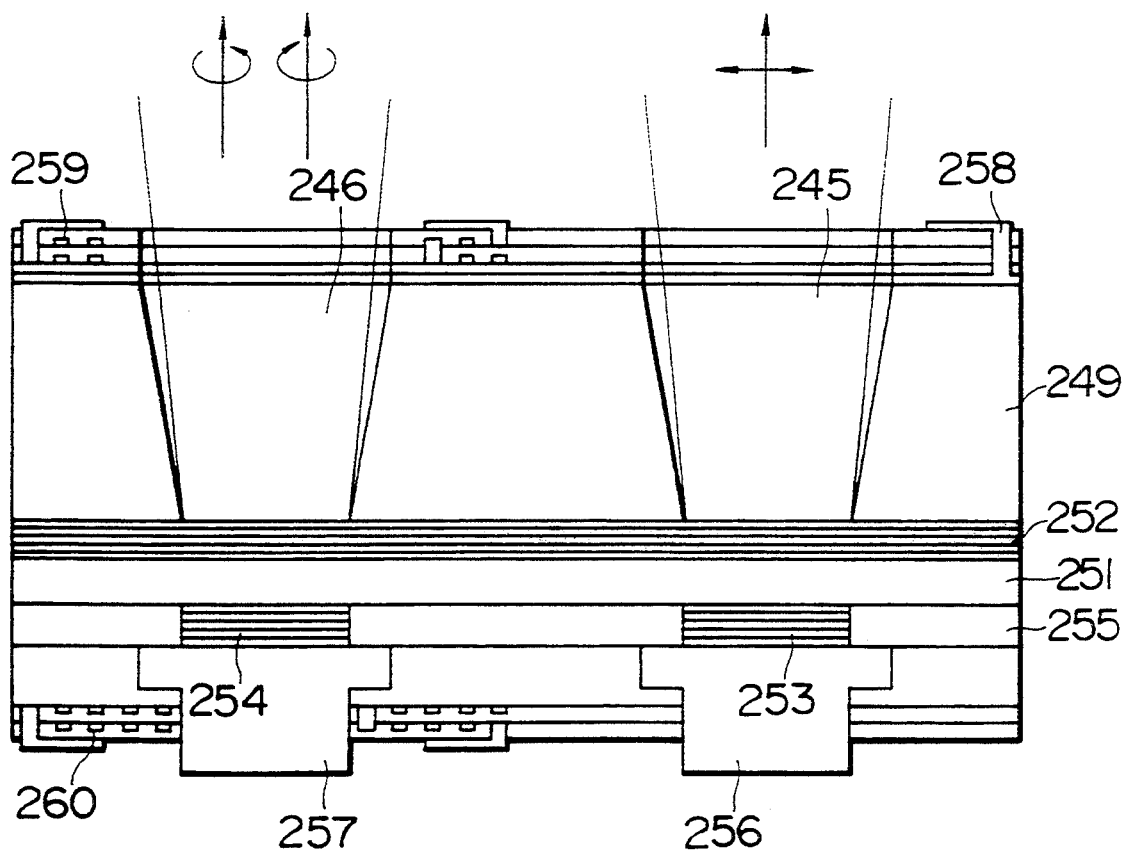

Another embodiment of the present invention will be described below with respect to FIGS. 25–27, 28A, 28B. FIG. 25 is a perspective view of a magneto-optical disk device using the present invention. FIG. 26 diagrammatically illustrates an optical pickup optical system. FIG. 27 is a plan view of the optical pickup optical system. FIGS. 28A and 28B are a perspective and a cross-sections view, respectively, of a laser source.

The light beam radiated from the laser source 221 of FIG. 25 enters a diffraction grating 226 provided on a prism 222. The light beam is then reflected by the grating to be focused by an objective 223 and cast on a magneto-optical disk 224. The light beam reflected by the disk 224 passes through the objective, and is diffracted by the diffraction grating 226, and cast on an optical integrated circuit 225.

As shown in FIG. 26, the integrated circuit 225 has a structure which includes a silicon substrate 228 and a sandwich of a high refractive index dielectric film 229 and lower refractive index dielectric films 230, 231, provided on the substrate 228. A grating coupler 227 is provided in the pickup system at a position where the light beam refracted by the refractive grating 226 enters to confine the entering light beam within the high refractive index dielectric film 229.

As shown in FIG. 27, optical waveguides 234, 235 and 236 each with a linear waveguide mirror 232 and a parabolic waveguide 233 are formed by etching of the dielectric films 229, 230 and 231 on the silicon substrate 228. The grating couplers 227 provided on the waveguides 234, 236 have a pitch and a pattern such that the TE mode components of the entering light beams are confined within the dielectric films 229. The grating coupler 227 provided on the waveguide 235 has a pitch and a pattern such that the TM mode component of the entering light beam is confined within the dielectric film 229. A light beam confined within the film 229 and propagating through each of the waveguides 234–236 is reflected and focused by the mirrors 232, 233 to enter the vicinity of the boundary of a respective of pairs of adjacent photodetectors 237, 238; 239, 240; and 241, 242 provided in the vicinity of ends of the corresponding waveguides 234–236.

Since the TE mode components of the light beams entering the grating couplers 227 propagate through the waveguides 234, 236, they can be recognized by taking the sum of the signals from the photodetectors 237, 238, 241, 242.

Since the TM mode component of the light beam entering the grating couplers 227 propagates through the waveguide 235, it can be recognized by taking the sum of the signals from the photodetectors 239, 240. Thus, the direction of polarization of the light beam entering the grating couplers 227 can be recognized by performing the operation $(a+b+e+f)-(c+d)$ where a–f are the outputs from the photodetectors 237–242, respectively. That is, when a linearly polarized light beam is radiated from the laser source 221, a reproduced magneto-optical signal is obtained.

When the disk 224 deviates from the focus of the objective 223, the focus of the objective in the vicinity of the boundary of the photodetectors 237, 238 and the focus of the objective in the vicinity of the boundary of the photodetectors 241, 242 move up and down, respectively, in FIG. 27. When, for example, the disk 224 moves away from the position of the focus of the objective 223, the focus of the objective in the vicinity of the boundary of the photodetectors 237, 238 moves upward in FIG. 27 and the focus of the objective in the vicinity of the boundary of the photodetectors 241, 242 moves downward, respectively, in FIG. 27. That is, the outputs of the photodetectors 38, 41 increase while the outputs of the photodetectors 237, 242 decrease. When the disk 224 moves toward from the position of the focus to the objective, reverse occurs. That is, by performing the operation $(a+f)-(b+e)$, an off-focus signal, i.e., a focusing error signal is obtained.

When the focus of the objective deviates from a recording track of the disk 224, quantities of light beams entering the grating couplers 227 provided on the waveguides 234, 236 change. Thus, the sum of signals from the photodetectors 237, 238 differs from the sum of signals from the photodetectors 241, 242. Thus, by performing the operation $(a+b)-(e+f)$, a signal indicative of a deviation of the beam spot from the recording track, i.e., a tracking error signal is obtained.

As shown in FIG. 28A, the laser source 221 is provided with a reproduction light emitter 245 and a recording light emitter 246, which have an elliptical and a circular opening, respectively.

FIG. 28B is a cross-sectional view of the laser source 221 of FIG. 28A. In the reproduction of information, electric currents flow from the electrodes 256, 258 through the substrate 249, Bragg reflectors of a semiconductor multi-layered film 252, 253 to the active layer 251. At this time, the currents are collected by the insulating layer 255 in the vicinity of the Bragg reflector 253 in the active layer 251. Since the reproducing light emitter 245 has the elliptical opening or window O, the reproducing light emitter 245 emits a linearly polarized light beam. In the recording of information, electric currents flow from the electrodes 257, 258 through the substrate 249, Bragg reflectors 252, 254 of a semiconductor multi-layered film to the active layer 251. At this time, the currents are collected by the insulating layer 255 in the vicinity of the Bragg reflector 254 for the active layer 251. In light emission, electric currents are fed to the coil windings 259, 260 to thereby apply a magnetic field to the active layer 251. By the influence of this magnetic field and due to the recording light emitter 246 being circular, the recording light emitter 246 emits a circularly polarized light beam. The direction of the polarization of this light beam can be changed by changing the direction of the magnetic field applied to the active layer 251.

Referring to FIGS. 22, 23A, 23B, the magneto-optical disk 224 has the same structure as the disk 203. By making a circularly polarized light beam enter the disk 224, information is written in a magneto-optical recording manner. In the reproduction of information, a linearly polarized light beam emitted from the reproduction light emitter 245 is used to reproduce information on the basis of a change in the direction of the polarization due to Kerr effect. Since the magnetization of the disk 203 is not caused by the linearly polarized light beam, no information is destroyed.

In FIG. 25, an external command to record/reproduce information is issued, for example from an external computer, through the terminal 269 to a system controller 268. Whichever the command is a one to record information or a one to reproduce information, the system controller 268 performs a predetermined operation on the outputs from the photodetectors 237-242 to generate a focusing error signal and a tracking error signal. The controller 268 feeds an electric current to the course actuator 263 and the fine actuator 264 on the basis of those signals and external commands to move the focus of the objective 223 to a predetermined position on the disk 224. Simultaneously, the controller 268 feeds an electric current to the spindle motor 262 to rotate the disk 224.

When the command is one to write information, the controller 268 feeds an electric current to the electrode 257, coils 259, 260 of the laser source 221 through a cable 267 in correspondence to the information to be recorded to thereby write the information on the disk. When the command is one to reproduce information, the controller 268 feeds electric power through the cable 67 to the electrode 256 of the laser source 221. The controller further performs a predetermined operation on the outputs from the photodetectors 237-242 to detect and output a magneto-optical signal therefrom. The disk 224 is removably fastened by a magnet chuck 261.

What is claimed is:

1. A magnetic recording and reproducing apparatus in which a light beam is radiated from a laser source onto a recording film on a magneto-optical disk for recording and reproducing information to and from the disk, comprising:

drive means for driving the disk rotationally;
    an optical head including a plurality of laser sources each for radiating a circularly polarized light beam responsive to a magnetic field applied thereto and driven to radially scan the disk with a spacing from the disk, and means for applying a magnetic field to the laser sources in the direction of their optical axes to control a direction of circular polarization of said circularly polarized light beam radiated by each of said plurality of laser sources; and
    an actuator for scanning said head.

2. A magnetic recording and reproducing apparatus which casts a light beam from a laser source on a recording film on a magneto-optical disk for recording and reproducing information to and from the disk;

drive means for driving the disk rotationally;
    an optical head which comprises a plurality of laser sources each scanned radially of the disk with a spacing from the disk for radiating a circularly polarized light beam and means for applying a magnetic field to the laser sources in the direction of their optical axes; and
    an actuator for scanning said head;
    wherein said laser sources and said magnetic field applying means comprise a substrate, an active layer provided on said substrate for emitting a light beam when supplied with an electric current, electrodes for supplying an electric current to said active layer, and means for applying a magnetic field on the active layer in the direction where the light beam propagates through said active layer, said magnetic field applying means comprising coil windings.

3. A magnetic recording and reproducing apparatus according to claim 1, wherein said optical head further comprises means for applying a stress or mechanical distortion to each of said plurality of laser sources in a direction perpendicular to their optical axes.

4. A magnetic recording and reproducing apparatus according to claim 1, further comprising means for switching the direction of polarization of the circularly polarized light beam.

5. An optical head comprising:

a laser source for radiating a circularly polarized light beam responsive to a magnetic field applied thereto;
    an optical system for focusing the light beam from said laser source; and
    means for applying a magnetic field to said laser source in the direction of the optical axis of said laser source to control a direction of circular polarization of said light beam radiated by said laser source.

6. An optical head comprising:

a laser source for radiating a circularly polarized light beam;
    an optical system for focusing the light beam from said laser source; and
    means for applying a magnetic field to said laser source in the direction of the optical axis of said laser source;
    wherein said laser source and said means for applying a magnetic field comprise a substrate, an active layer provided on said substrate for emitting a light beam when supplied with an electric current, electrodes for supplying an electric current to said active layer, and means for applying a magnetic field on the active layer in the direction where the light beam propagates through said active layer, said magnetic field applying means comprising coil windings.

7. An optical head according to claim 5, wherein said optical head further comprises means for applying a stress or mechanical distortion to said laser source in a direction perpendicular to the optical axis.

8. An optical head according to claim 5, further comprising means for switching the direction of polarization of the circularly polarized light beam.

9. A laser source comprising:

a laser section for radiating a circularly polarized light beam responsive to a magnetic field applied thereto; and means for applying a magnetic field to said laser section in an optical axis direction of said laser section to control a direction of circular polarization of said circularly polarized light beams radiated by said laser section.

10. A laser source comprising:

a laser section for radiating a circularly polarized light beam; and means for applying a magnetic field to said laser section in the optical axis direction of said laser section;

wherein said laser section and said means for applying a magnetic field comprise a substrate, an active layer provided on said substrate for emitting a light beam when supplied with an electric current, electrodes for supplying an electric current to said active layer, and means for applying a magnetic field on the active layer in the direction where the light beam propagates through said active layer, said magnetic field applying means comprising coil windings.

11. A laser source according to claim 9, further comprising means for applying a stress or mechanical distortion to said laser section in a direction perpendicular to the optical axis.

12. A laser source according to claim 9, further comprising means for switching the direction of polarization of the circularly polarized light beam.

13. A laser source comprising:

an active layer supplied with an electric current for radiating a light beam;

an electrode for supplying an electric current to said active layer;

a resonator comprising a pair of opposing reflecting means between which said active layer is disposed for reflecting the light beam radiated from said active layer;

said active layer and said resonator each having a structure axially symmetrical around the optical axis of a light beam which resonates in said resonator; and a coil winding for applying a magnetic field to said active layer such that the magnetic field acting on the active layer is coincident in direction with the direction of light beam propagating through said active layer.

14. A magneto-optical disk comprising a multi-layered film provided on a base plate, said multi-layered film including a thin magnetic film to and out of which information is recorded and reproduced by optical means, said multi-layered film including a film layer having a thickness for exhibiting a quantum well structure and resonating with a light beam radiated on the disk in the recording of information.

15. A magneto-optical disk according to claim 14, wherein said multi-layered film has a periodic structure including a plurality of identical sets of films laminated one on another where one set of films constitutes one period and an optical path length for one period is one fourth of the wavelength of the light beam radiated on the disk in the recording of information.

16. An optical head comprising a laser source, a first optical system for casting a light beam radiated from said laser source on an optical information medium, a photodetector for converting an optical signal to an electrical signal, and a second optical system for guiding a light beam transmitting through or reflected by said optical information medium to said photodetector, wherein said laser source includes an active layer supplied with an electric current for radiating a light beam, a pair of electrodes for supplying an electric current to said active layer, and a resonator having a pair of opposing reflecting means between which said active layer is disposed for reflecting the light beam radiated from said active layer, each of said active layer and said resonator having a structure axially symmetrical around the optical axis of a light beam which resonates in said resonator and a coil winding for applying a magnetic field to said active layer with the magnetic field acting on the active layer being coincident in direction with the light beam propagating through said active layer.

17. An optical head according to claim 16, wherein said laser source has a structure for radiating a circularly polarized light beam and means for switching the circularly polarized light beam between a right- and a left-handed circularly polarized light beam.

18. A magneto-optical recording and reproducing apparatus comprising a magneto-optical disk, a spindle motor for rotating said disk, an optical head for casting a light beam on said disk to record information on said disk and providing reproduction of information and detection of a servo signal from a light beam passing through or reflected by said disk, an actuator for moving said head to cast the light beam cast from said head on said disk at a predetermined position, and a system controller for feeding an electric current to said spindle motor and said actuator on the basis or the servo signal from said head and an external signal for controlling the operation of said spindle motor and said actuator and modulating the light beam cast on said disk in correspondence to the external signal in the recording of the information and outputting the information reproduced by said head out of said apparatus in the reproduction of the information, said magneto-optical disk comprising a multi-layered film including a thin magnetic film provided on a base plate, said multi-layered film including a film layer having a thickness for exhibiting a quantum well structure and resonating with a light beam cast on the disk in the recording of information; and said optical head comprising a laser source, a first optical system for casting a light beam radiated from said laser source on a magneto-optical disk, a photodetector for converting a light beam to an electrical signal, and a second optical system for guiding a light beam passing through or reflected by said disk to said photodetector, said laser source including an active layer supplied with an electric current for radiating a light beam, a pair of opposing electrodes for supplying an electric current to said active layer, a resonator comprising a pair of reflecting means between which said active layer is disposed for reflecting the light beam radiated from said active layer, said active layer and said resonator each having a structure axially symmetrical around the optical axis of a light beam which resonates in said resonator, and a coil winding for applying a magnetic field to said active layer with the magnetic field acting on the active layer being coincident in direction with the light beam propagating through said active layer.

19. A magneto-optical recording and reproducing apparatus according to claim 18, wherein said laser source has a structure for radiating a circularly polarized light beam and means for switching the circularly polarized light beam between a right- and a left-handed circularly polarized light beam.

20. A magneto-optical recording and reproducing apparatus according to claim 18, wherein said multi-layered film has a periodic structure where an optical path length for one period is one fourth of the wavelength of a light beam cast on the disk in the recording of information.

21. An optical head comprising a semiconductor laser unit and a coil winding layer unit formed on said semiconductor unit integrally therewith, wherein:
   said semiconductor laser unit including a semiconductor substrate, a first resonator layer formed on said substrate, a semiconductor active layer formed on said first resonator layer, and a second resonator layer formed on said semiconductor active layer, said first and second resonator layers serving as a resonator for said semiconductor laser unit so that a light beam is generated from said active layer in a direction substantially perpendicular to said active layer; and
   said coil winding layer unit includes a coil winding formed in an insulating material provided on said substrate and arranged to generate a magnetic field to be applied to said active layer, said magnetic field to be applied to said active layer being in a direction substantially parallel with an axis of said light beam to be generated by from said active layer.

22. An optical head comprising a semiconductor laser unit and a coil winding layer unit formed on said semiconductor unit integrally therewith, wherein:
   said semiconductor laser unit having first and second lasing sections and including a semiconductor substrate, a common first resonator layer formed on said substrate, a common semiconductor active layer formed on said common first resonator layer, and two second resonator layers formed on said semiconductor active layer, said common first resonator layer and one of said second resonator layers serving as a first resonator, and said common first resonator layer and the other second resonator layer serving as a second resonator for said semiconductor laser unit so that a light beam is generated from said active layer with one of said first and second resonators in a direction substantially perpendicular to said active layer, whereby said first lasing section is constituted by said semiconductor substrate, said common first resonator layer and said one second resonator layer, and said second lasing section is constituted by said semiconductor substrate, said common first resonator layer and said other second resonator layer; and
   said coil winding layer unit includes a coil winding formed in an insulating material provided on said substrate and arranged to generate a magnetic field to be applied to said active layer, said magnetic field to be applied to said active layer being in a direction substantially parallel with an axis of said light beam to be generated by from said active layer.

23. An optical head comprising a semiconductor laser unit, a coil winding layer unit and an optical detector unit, said units being formed integrally with and one another, wherein:
   said semiconductor laser unit is formed on a semiconductor substrate and includes a semiconductor active layer, first and second resonator layers forming a resonator sandwiching said active layer so that a light beam is generated from said active layer in a direction substantially perpendicular to said active layer;
   said coil winding layer unit includes a coil winding formed in an insulating material provided on said substrate and arranged to generate a magnetic field to be applied to said active layer, said magnetic field to be applied to said active layer being in a direction substantially parallel with an axis of said light beam to be generated by from said active layer;
   said optical detector unit includes first and second semiconductor layers formed at different levels in said semiconductor substrate, said first and second semiconductor layers having a conductivity type different from that of said substrate; and
   means attached to said substrate for causing stress in said active layer.

24. An optical head comprising a plurality of semiconductor laser units, a plurlity of coil winding layer units, a plurality of first optical detector units for signal reproduction and a plurality of second optical detector units for tracking/forcusing control, said units being formed integrally with and one another, wherein:
   each of said semiconductor laser units is formed on a semiconductor substrate and includes a semiconductor active layer, first and second resonator layers forming a resonator sandwiching said active layer so that a light beam is generated from said active layer in a direction substantially perpendicular to said active layer;
   each of said coil winding layer units is provided for a different one of said semiconductor laser units and includes a coil winding formed in an insulating material provided on said substrate and arranged to generate a magnetic field to be applied to said active layer, said magnetic field to be applied to said active layer being in a direction substantially parallel with an axis of said light beam to be generated by from said active layer;
   each of said first optical detector units is provided for a different one of said semiconductor laser units and includes first and second semiconductor layers formed at different levels in said semiconductor substrate, said first and second semiconductor layers having a conductivity type different from that of said substrate;
   each of said second optical detector units is provided for a different one of said semiconductor laser units and is formed in said semiconductor substrate; and
   means is provided for causing stress in said active layer.

25. A magnetic recording and reproducing apparatus according to claim 1, wherein said magneto-optical disk comprises a magneto-optical recording medium including:
   a transparent base plate;
   a semiconductor film formed on said base plate and having a thickness such that the semiconductor film has a quantum well structure and that a light beam emitted to the recording medium from a laser light source is subjected to a resonance in said semiconductor film;

an intermediate film made of a material different from that of said semiconductor film and having a thickness t defined by $t=\lambda/(4n)$, where $\lambda$ and n represent a wavelength of said light beam and a refractive index of said intermediate film; and a magnetic film formed on said intermediate film so that said light beam impinges thereon after having passed through said base plate, said semiconductor film and said intermediate film.

26. A magnetic recording and reproducing apparatus according to claim 1, wherein said plurality of laser sources are provided on a single substrate, each of said plurality of laser sources includes an emitting section for radiating the circularly polarized light beam and electrodes through which an electric current is supplied to said emitting section for radiation of the controlled circularly polarized light beam by said emitting section with said magnetic field applied thereto, and said magnetic field applying means for said laser sources are provided on said single substrate.

27. An optical head according to claim 5, wherein said laser source includes a substrate, an emitting section provided on said substrate for radiating the circularly polarized light beam and electrodes through which an electric current is supplied to said emitting section for radiation of the controlled circularly polarized light beam by said emitting section with said magnetic field applied thereto, and said magnetic field applying means for said laser sources are provided on said substrate.

28. A laser source according to claim 9, wherein said emitting section and said magnetic field applying means are provided on a single substrate.

* * * * *